(12) United States Patent
Fillion et al.

(10) Patent No.: US 10,692,737 B2
(45) Date of Patent: Jun. 23, 2020

(54) MULTILAYER INTERCONNECT STRUCTURE WITH BURIED CONDUCTIVE VIA CONNECTIONS AND METHOD OF MANUFACTURING THEREOF

(71) Applicant: General Electric Company, Schenectady, NY (US)

(72) Inventors: Raymond Albert Fillion, Niskayuna, NY (US); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/153,905

(22) Filed: Oct. 8, 2018

(65) Prior Publication Data

US 2020/0111680 A1 Apr. 9, 2020

(51) Int. Cl.
| | |
|---|---|
| *H01L 23/48* | (2006.01) |
| *H01L 29/40* | (2006.01) |
| *H01L 23/52* | (2006.01) |
| *H01L 21/48* | (2006.01) |
| *H01L 23/498* | (2006.01) |
| *H01L 23/538* | (2006.01) |
| *H01L 25/00* | (2006.01) |

(52) U.S. Cl.
CPC ......... *H01L 21/486* (2013.01); *H01L 21/481* (2013.01); *H01L 21/4857* (2013.01); *H01L 23/49822* (2013.01); *H01L 23/5389* (2013.01); *H01L 25/50* (2013.01)

(58) Field of Classification Search
CPC ............. H01L 21/486; H01L 23/49827; H01L 23/5383; H01L 2224/16145; H01L 23/5384; H01L 23/5226

USPC .................................................. 257/750, 758
See application file for complete search history.

(56) References Cited

U.S. PATENT DOCUMENTS

| | | | |
|---|---|---|---|
| 6,239,482 B1 | 5/2001 | Fillion et al. | |
| 6,396,153 B2 | 5/2002 | Fillion et al. | |
| 6,660,945 B2* | 12/2003 | Boyko | H01L 23/49827 |
| | | | 174/262 |
| 7,081,650 B2 | 7/2006 | Palanduz et al. | |
| 7,964,974 B2 | 6/2011 | Fillion et al. | |
| 8,008,781 B2 | 8/2011 | Fillion et al. | |

(Continued)

*Primary Examiner* — S. V. Clark
(74) *Attorney, Agent, or Firm* — Ziolkowski Patent Solutions Group, SC

(57) ABSTRACT

An electronics package includes a multilayer interconnect structure comprising insulating substrate layers and conductor layers. The electronics package also includes an electrical component comprising I/O pads electrically coupled to the conductor layers and conductive through vias extending through at least two insulating substrate layers and electrically connected to at least a portion of the I/O pads. The conductor layers include a first conductor layer including a ground plane buried in the multilayer interconnect structure, the ground plane forming direct electrical and physical connections with a conductive through via electrically connected to a ground I/O pad of the plurality of I/O pads. The conductor layers also include a second conductor layer including a power plane buried in the multilayer interconnect structure, the power plane forming direct electrical and physical connections with a conductive through via that is electrically connected to a power I/O pad of the plurality of I/O pads.

16 Claims, 24 Drawing Sheets

(56) References Cited

U.S. PATENT DOCUMENTS

| | | | |
|---|---|---|---|
| 8,498,131 B2 | 7/2013 | Fillion et al. | |
| 8,912,670 B2 * | 12/2014 | Teh | H01L 25/18 |
| | | | 257/796 |
| 2004/0000425 A1 * | 1/2004 | White | H01F 41/041 |
| | | | 174/250 |
| 2005/0099783 A1 * | 5/2005 | Alcoe | H01L 23/49822 |
| | | | 361/748 |
| 2005/0112798 A1 * | 5/2005 | Bjorbell | H01L 23/5385 |
| | | | 438/106 |
| 2007/0231962 A1 | 10/2007 | Fujii | |
| 2008/0217050 A1 * | 9/2008 | Egitto | H01L 21/4853 |
| | | | 174/262 |
| 2009/0140400 A1 | 6/2009 | Amey, Jr. et al. | |
| 2010/0237492 A1 | 9/2010 | Sasaki et al. | |
| 2013/0320530 A1 | 12/2013 | Koey et al. | |
| 2015/0084206 A1 * | 3/2015 | Lin | H01L 23/3135 |
| | | | 257/774 |

* cited by examiner

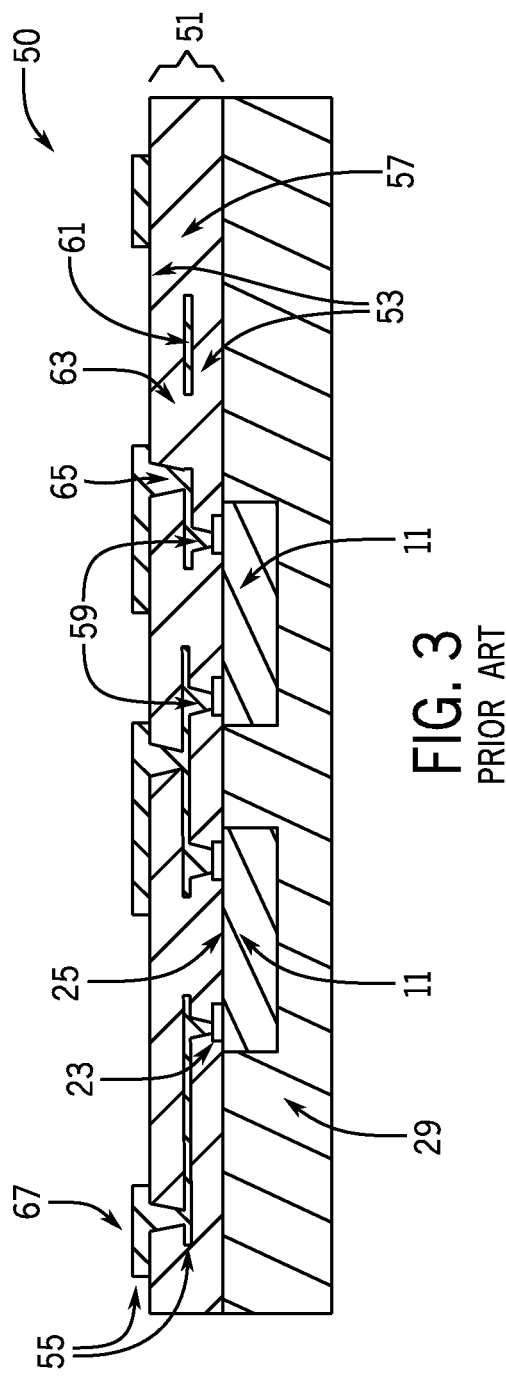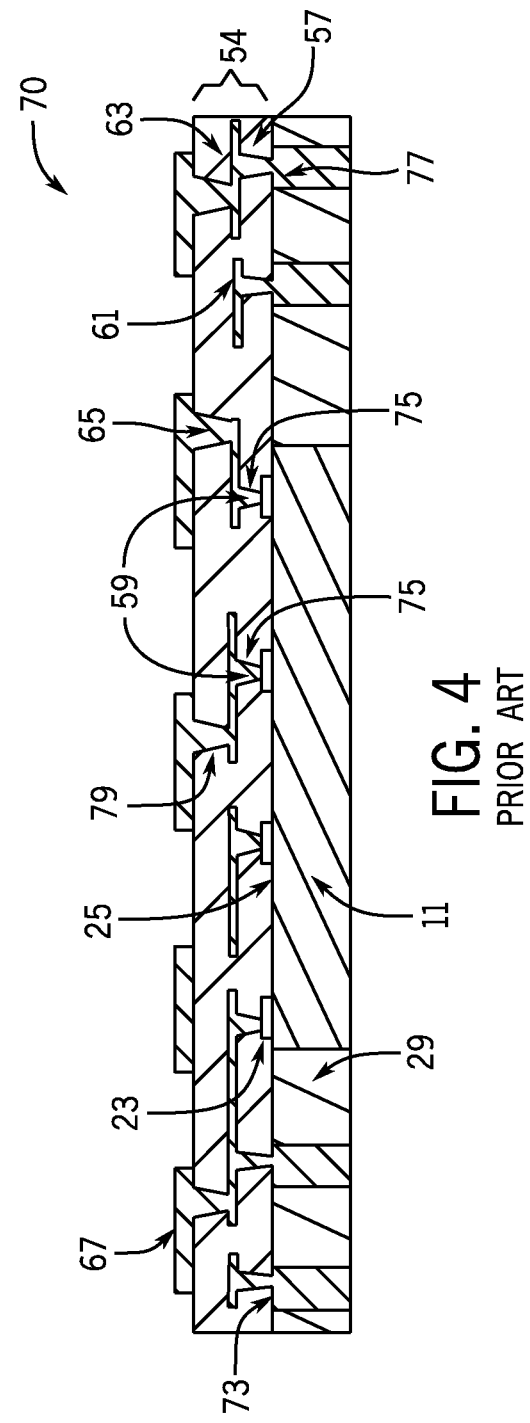

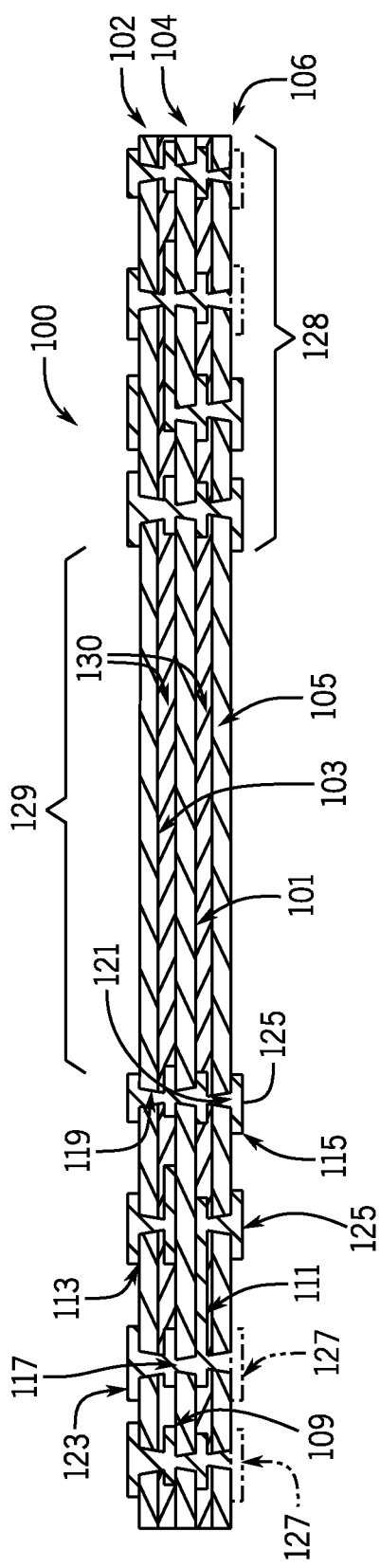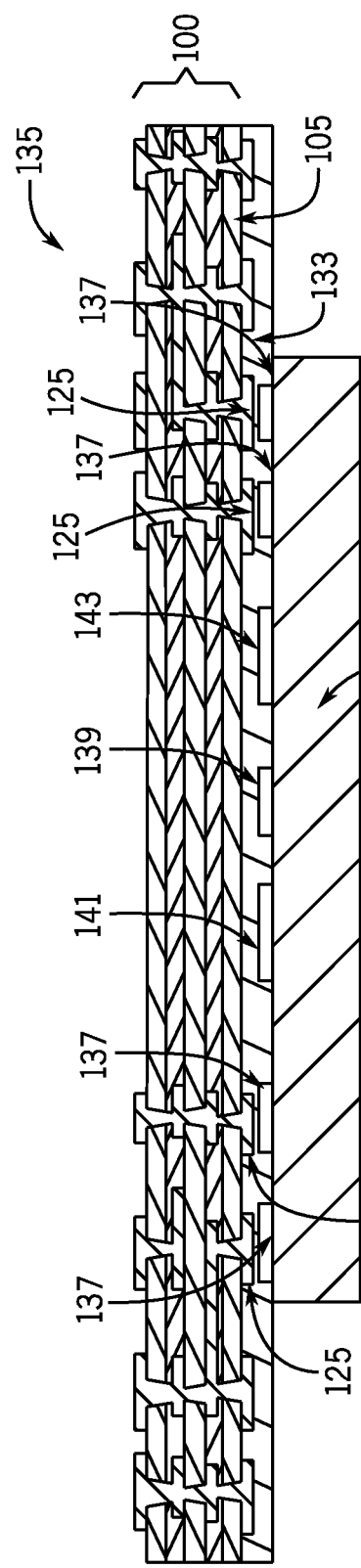

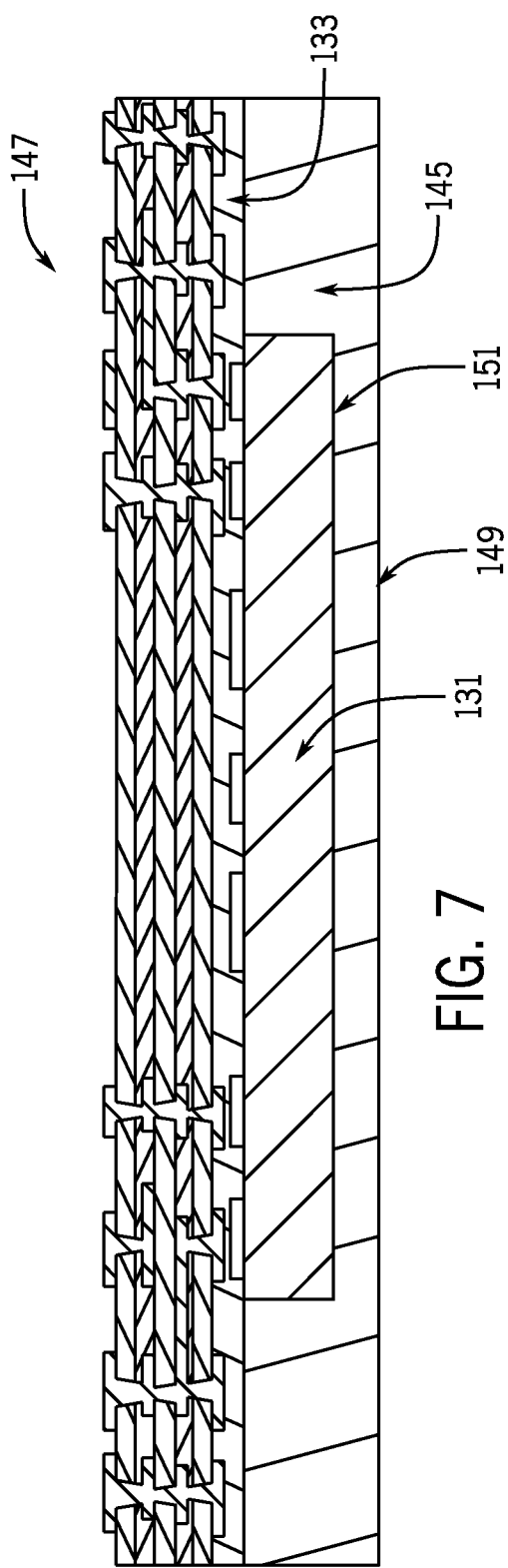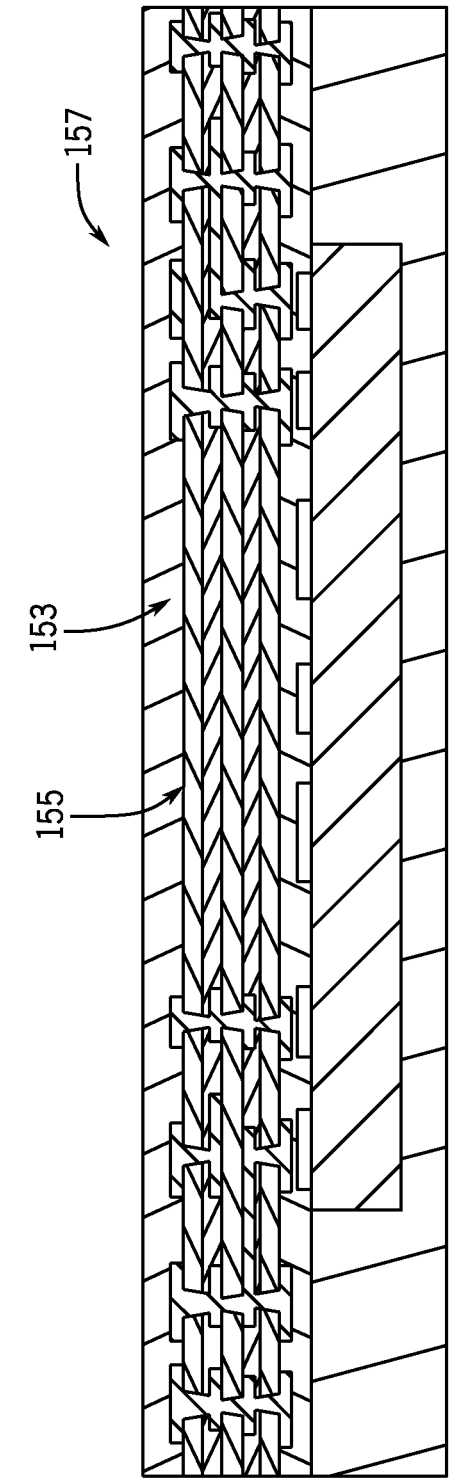

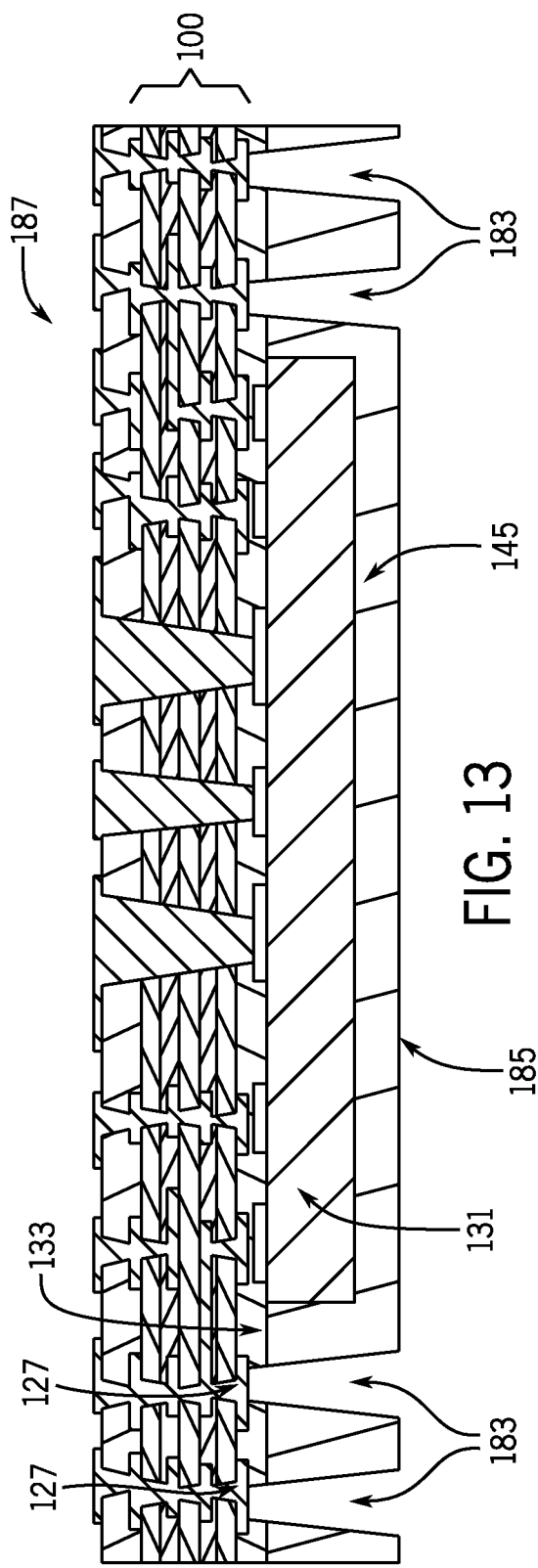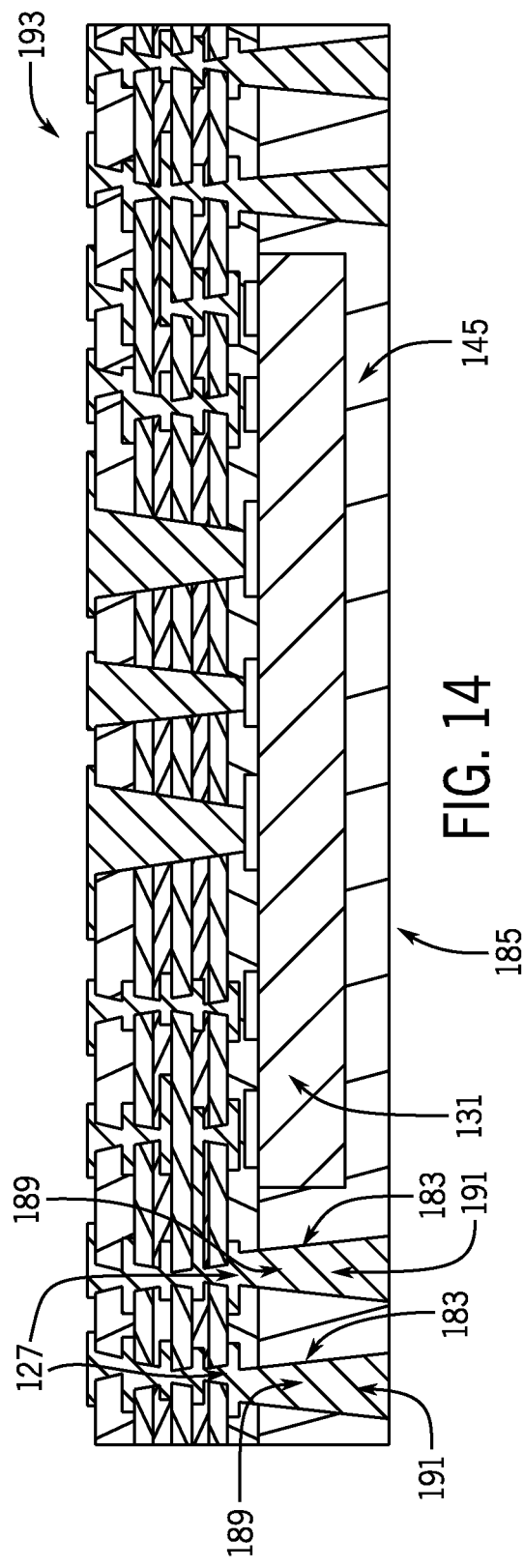

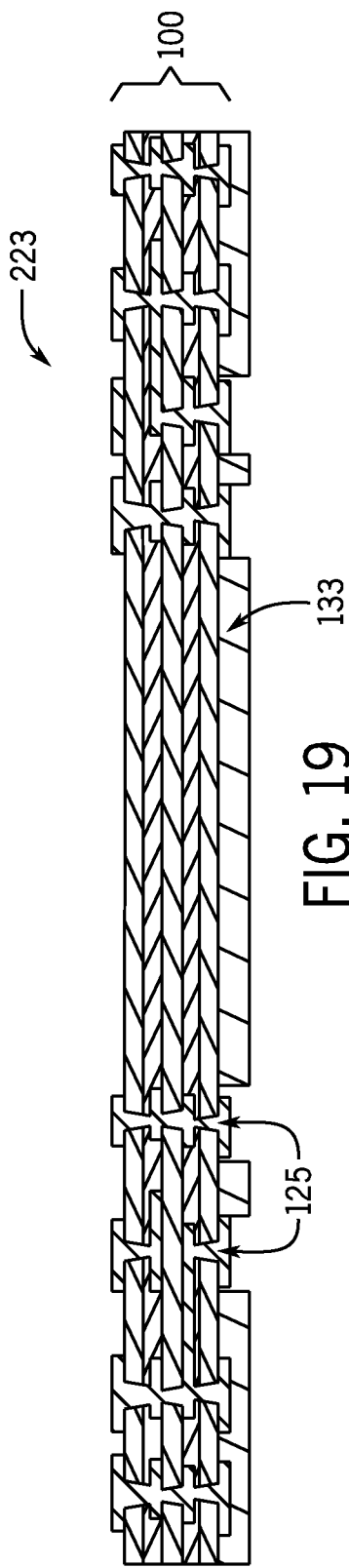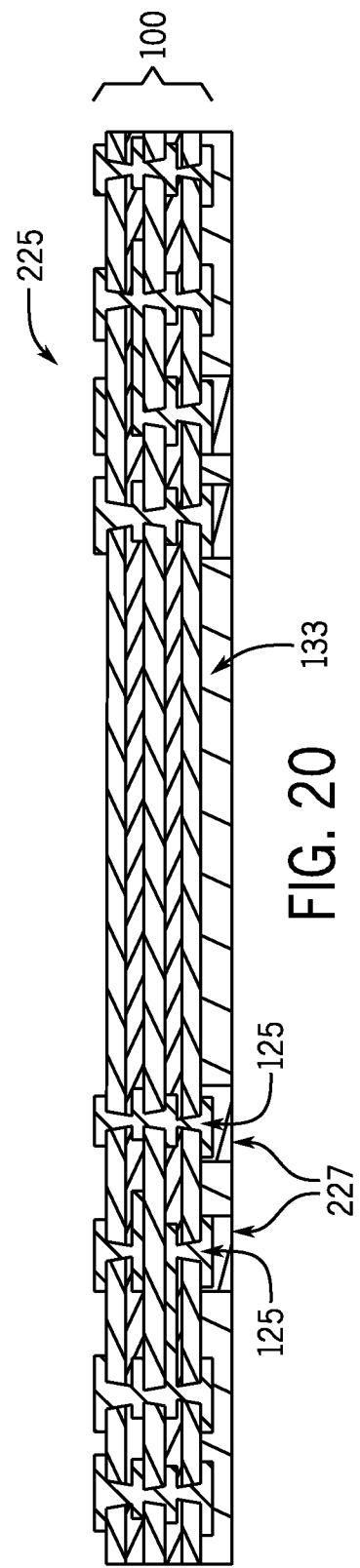

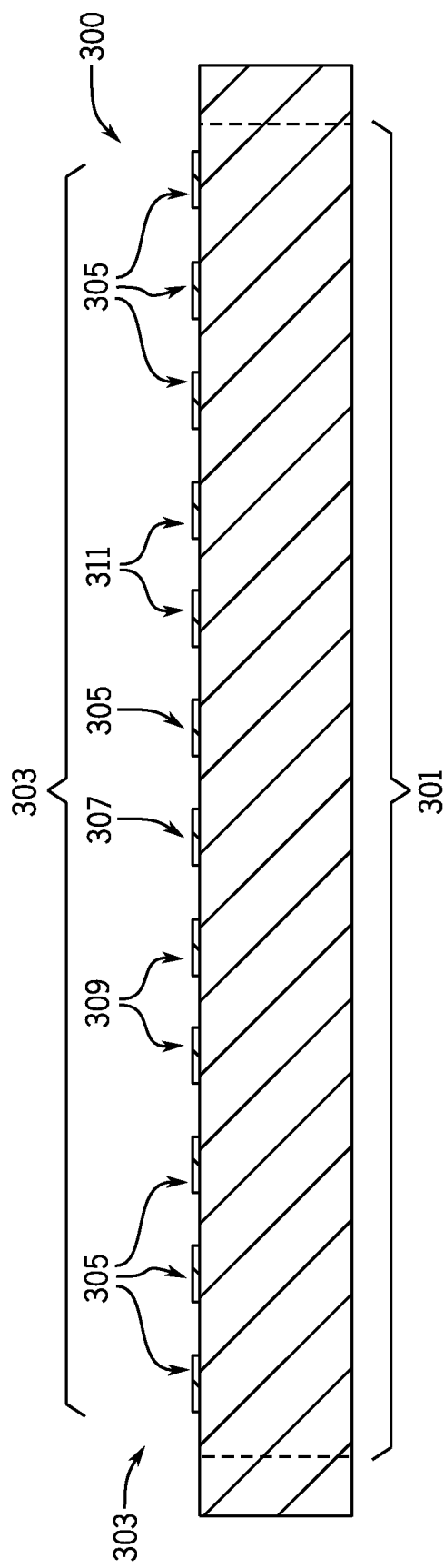
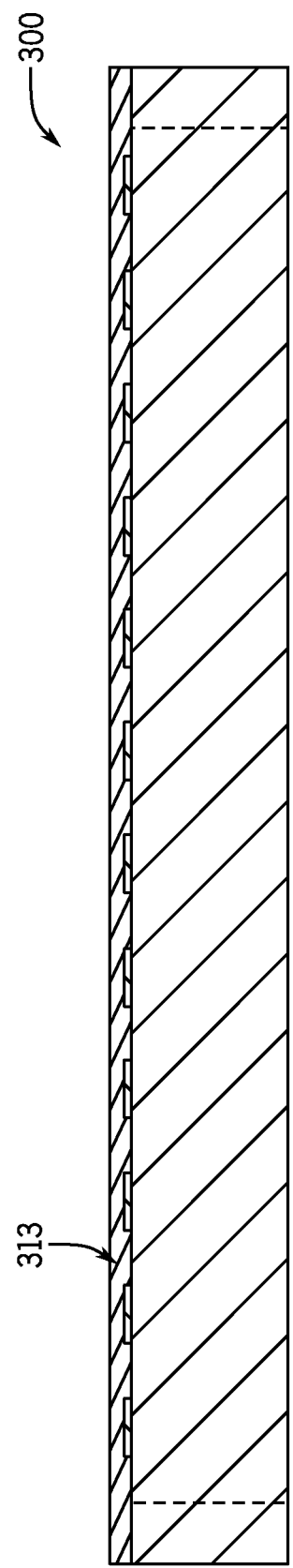
FIG. 23A
FIG. 23B

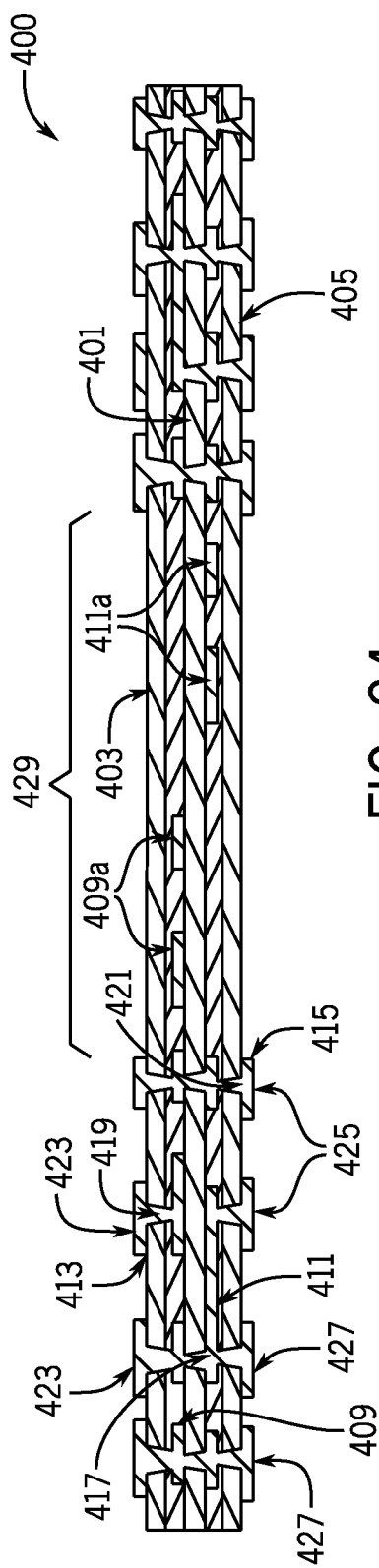
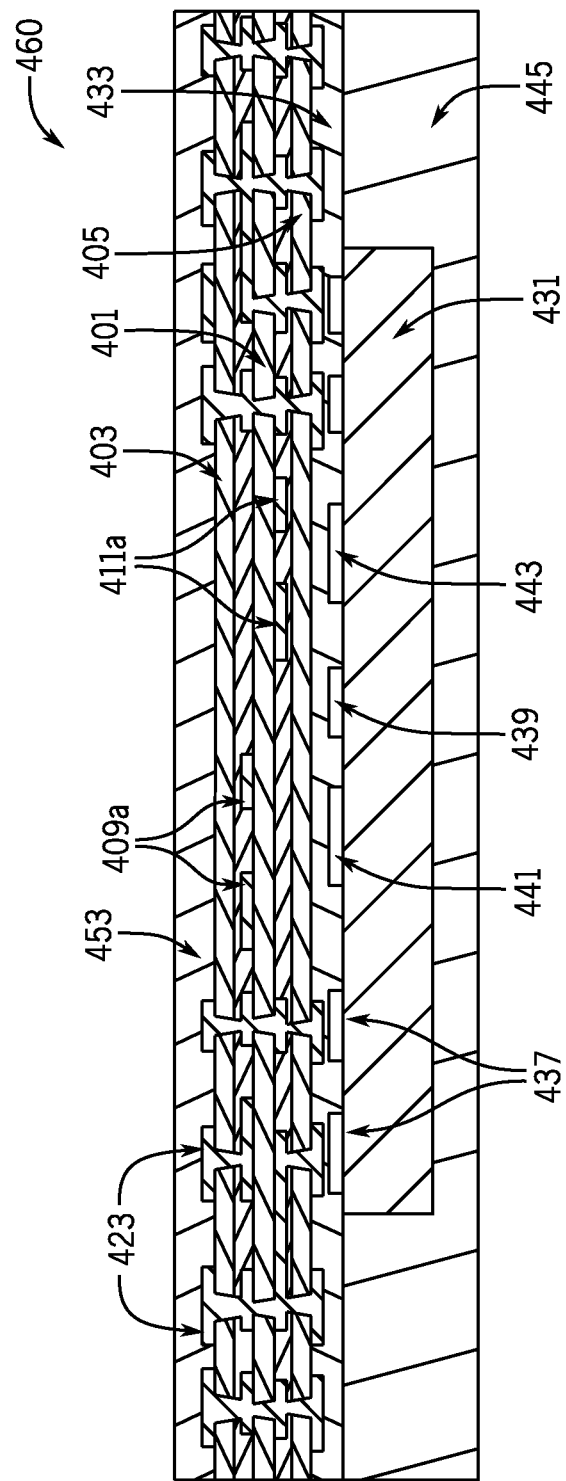
FIG. 24
FIG. 25

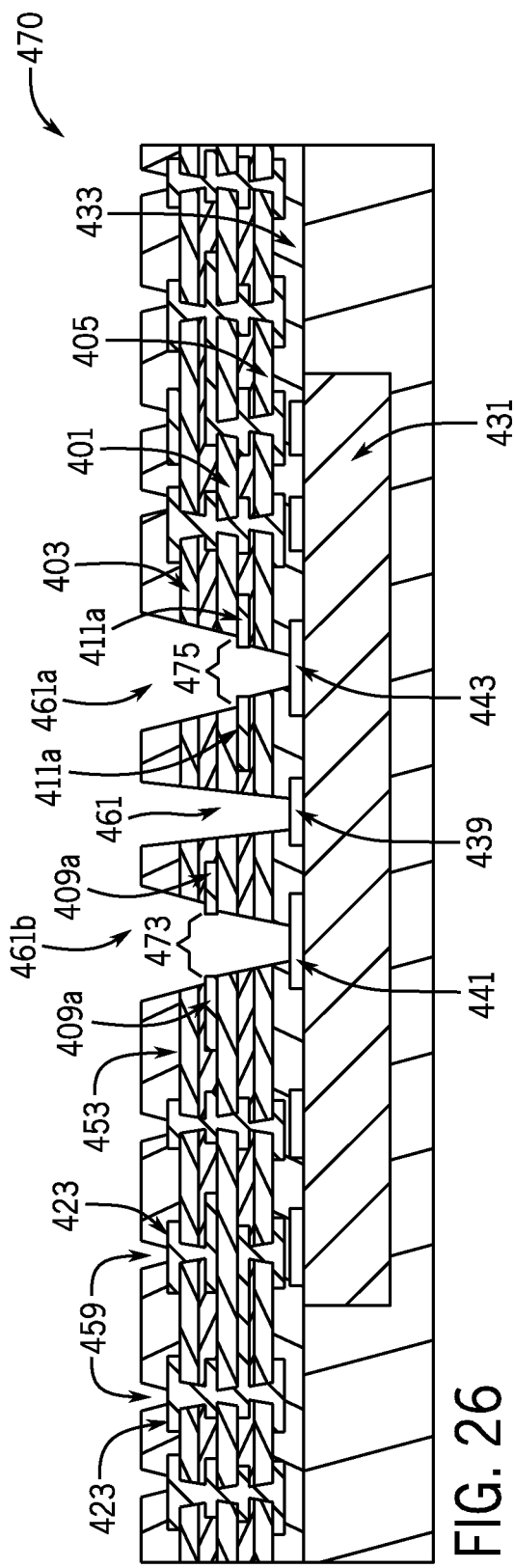
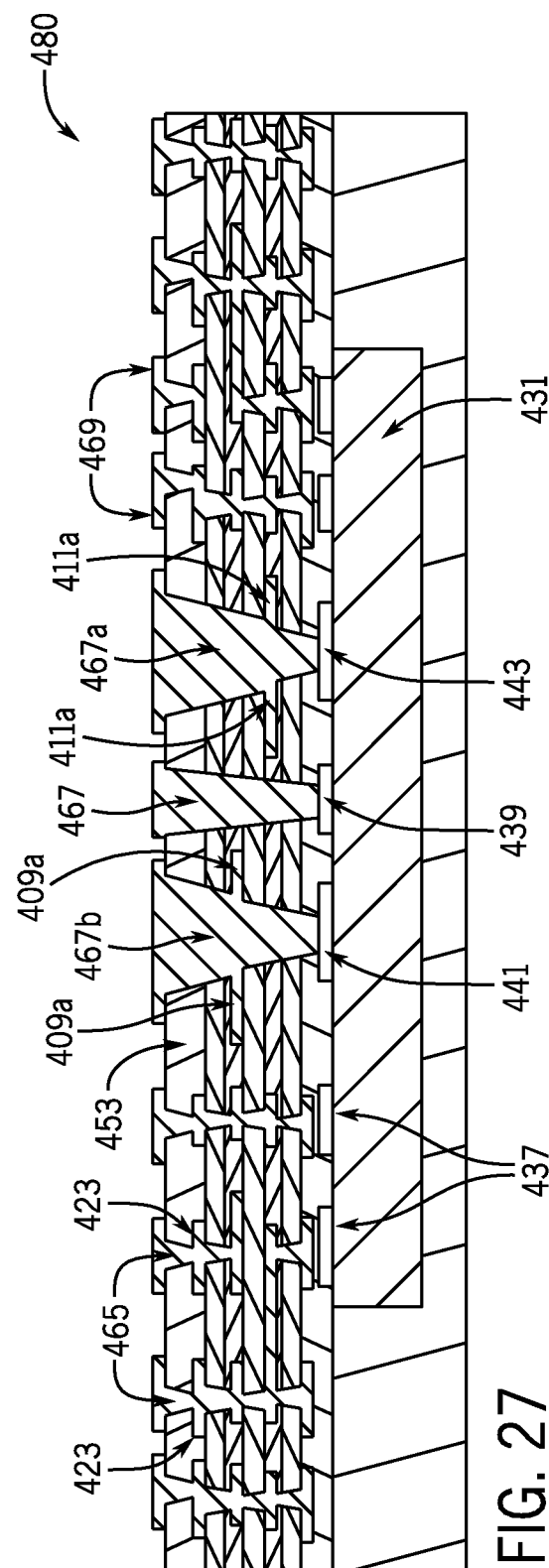
FIG. 26
FIG. 27

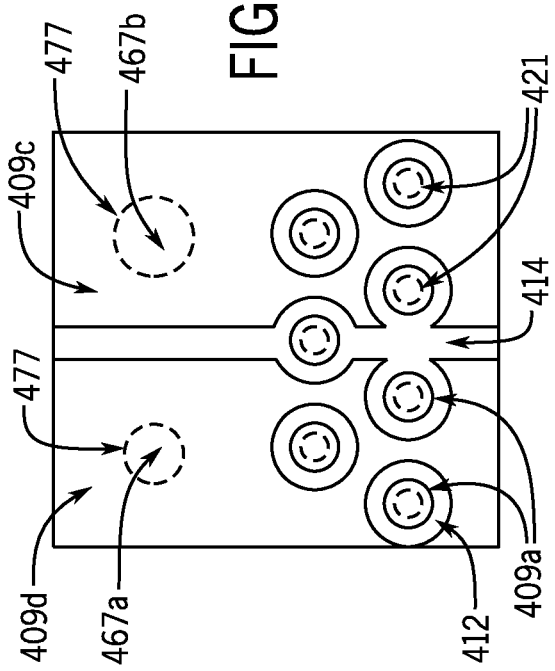
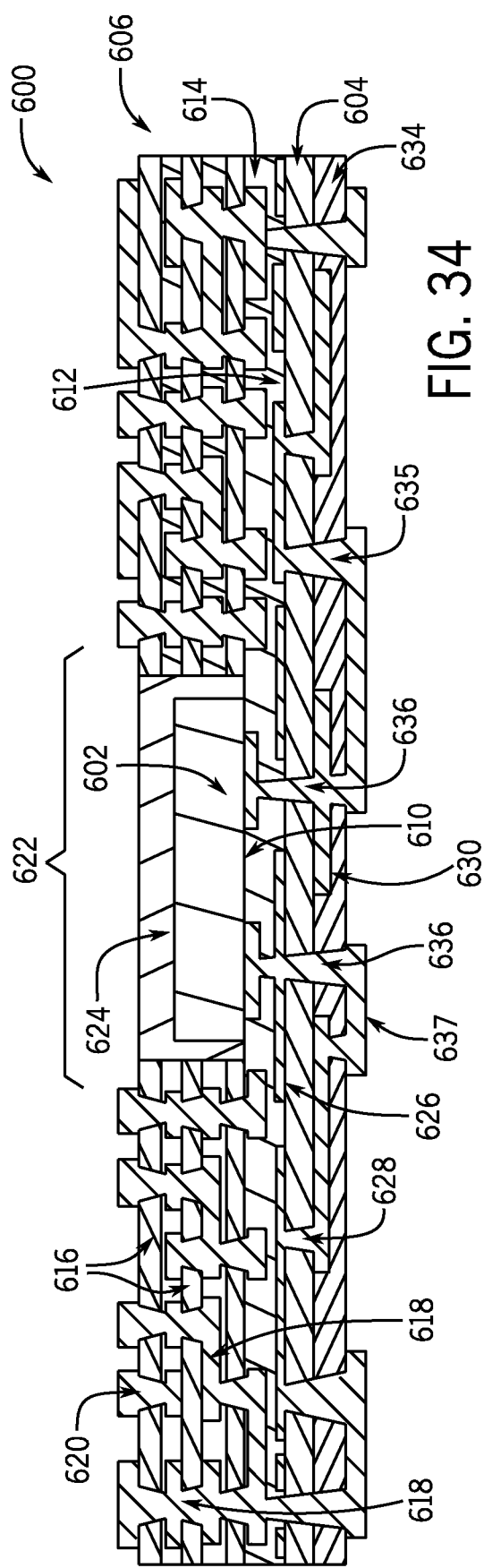

MULTILAYER INTERCONNECT STRUCTURE WITH BURIED CONDUCTIVE VIA CONNECTIONS AND METHOD OF MANUFACTURING THEREOF

BACKGROUND OF THE INVENTION

Embodiments of the invention relate generally to semiconductor device packages or electronics packages and to a device-almost last method of manufacturing thereof. An embedded device module with a complex semiconductor device or chip (with hundreds or thousands of I/O terminals) is embedded under a prefabricated multilayer interconnect structure, with the semiconductor device attached to the prefabricated multilayer interconnect structure after it is tested thereby avoiding committing the semiconductor device to an interconnect structure with a potential defect. Two different types of interconnects are used to connect the device to the interconnect structure—a high density, moderate performance connection for signal pads and a high performance, moderate density connection for high performance controls, power, and ground pads. Minimal interconnect processing is performed after the semiconductor device is attached, thereby increasing yield and lowering costs while attaining the high electrical performance inherent with an embedded device structure.

State of the art electronics packaging covers a wide range of methods, structures, and approaches from wire bond modules to flip chip modules and to embedded device/chip modules. Wire bonded modules are a mature packaging approach that is low cost but has poor electrical performance and has limited input/output (I/O) capability. These modules use wires bonded to device pads to connect the top I/O pads of semiconductor devices to an interconnect structure such as a multilayered organic or ceramic substrate with multiple dielectric and patterned metal layers. An exemplary construction of a prior art wire bond electronics package 10 is illustrated in FIG. 1 with two semiconductor devices 11 mounted onto a multilayer substrate 13 using die attach material 15 on topside 17. Wire bonds 21 connect die pads 23 located on the active surface 25 of semiconductor devices 11 to conductive pads 27 on the topside 17 of multilayer substrate 13. Molding resin 29 encapsulates semiconductor devices 11, wire bonds 21, and exposed portions of multilayer substrate 13. Multilayer substrate 13 has backside terminals 31 that are connected to conductive pads 27 by through holes 33. Multilayer substrate 13 may have multiple dielectric layers 35, multiple buried conductor layers 37, and multiple layer to layer vias 39. Wire bonds have inherently high inductance and series resistance, current crowding on the bond pads, and can cause microcracking within the semiconductor devices 11 near bonding sites. They are limited to I/O pads in one to three rows of die pads 23 located on the perimeter edges of the devices 11 and typically are limited to a few hundred I/Os.

Prior art flip chip modules use an array of terminal pads dispersed over the full surface of the semiconductor device to interconnect the device I/Os to a package or substrate. The device I/O pads can be in a fully populated array of pads or in a partially depopulated array of pads. Solder bumps are formed on each pad forming an array of solder spheres that are used to flip attach the device onto a package base, substrate, or board that has a matching array of pads. Although the pitch of the solder pads is larger than the pitch of wire bond pads, the array pads utilize the whole device surface and can contain 5× to 20× more pads than a wire bonded device. The solder bumps have larger cross-sections than wire bonds (>20×) and have a much shorter electrical path (>10×) than wire bonds and therefore have higher current carrying capability (>5×) and higher frequency capability (5X). A general construction of a prior art flip chip electronic package 40 is illustrated in FIG. 2 with two semiconductor devices 11 attached to multilayer substrate 13. Flip chip solder bumps 41 are applied to conductive pads 27 on multilayer substrate 13 and coupled to die pads 23. Molding resin 29 encapsulates the semiconductor devices 11. While flip chip modules such as that illustrated in FIG. 2 provide some advantages over wire bond technology, solder has poor electrical conductivity and is susceptible to both solder fatigue and electro-migration failures and the flipped chip has a very poor thermal cooling pathway.

Embedded device or chip modules and Fan-Out Wafer Level Packages (WLPs) are packaging approaches that address the limitations of wire bond and flip chip packages by eliminating wire bonds and solder bumps and replacing them with direct metallization contacts. Embedded device modules and Fan-Out WLPs are moving into the mainstream of microelectronics packaging for low and mid-complexity semiconductor devices, with these approaches being driven by the latest portable electronics devices, such as smart phones, as each new generation of smart phones puts more function into a smaller space with the requirement that the electronics consume less power. Embedded device modules combine multiple electronic devices, such as semiconductor devices or chips, capacitors, resistors and/or inductors in a common package using an interconnect structure that overlies the components and provides direct metallurgical interconnect to component terminals that minimizes interconnect parasitics. Combining multiple electronic devices in the same embedded device module with its lower parasitics provides higher electrical performance, faster operation, and lower power dissipation, while reducing the function's footprint saving board space. Fan-Out WLPs fan out the semiconductor device I/O terminals from the restricted area of the device surface to a larger footprint by fabricating an overlay interconnect structure on the surface of the semiconductor device that extends over an off-device molded region. This allows device I/O pitch to be relaxed to a larger I/O terminal pitch that facilitates attachment to a printed circuit board (PCB). The larger pitch reduces PCB complexity and lowers its costs and increases its yields. It also increases assembly yields, further lowering costs. Fan-Out WLPs can be used as stand-alone surface mounted devices or they can include feed throughs that enable incorporation into Package-on-Package (POP) assembly.

A general construction of a prior art embedded device electronic package 50 is illustrated in FIG. 3 with two semiconductor devices 11 attached to multilayer overlay insulating substrate structure 51. Multilayer overlay insulating substrate structure 51 has multiple insulating substrate layers 53 and multiple wiring layers 55. Structure 51 also includes lower overlay insulating substrate layer 57 with first microvia connections 59 extending through lower overlay insulating substrate layer 57 to die pads 23 of semiconductor devices 11 and connect them to buried wiring layer 61. An upper overlay insulating substrate layer 63 with second microvia connections 65 extends through the upper overlay insulating substrate layer 63 to buried wiring layer 61 and connecting to topside wiring layer 67. Molding resin 29 encapsulates the semiconductor devices 11. The multilayer overlay insulating substrate structure 51 with its direct metallization to die pads 23 through first microvia connections 59 eliminate 90% of the interconnect parasitics associated with wire bonded modules and flip chip modules.

Most importantly, interconnect structure defects such as wiring shorts and opens and high resistance or open microvia would cause the scrapping of good semiconductor device that are attached to a die site that had an interconnect defect.

A general construction of a prior art Fan-Out Wafer Level Package (WLP) 70 is depicted in FIG. 4 with one semiconductor device 11 molded into resin material 29. An overlay insulating substrate structure 54 lies over the active surface 25 of the semiconductor device 11 and the top surface 73 of resin material 29. Generally, the process of forming the Fan-Out WLP 70 starts with embedding semiconductor device 11 in resin material 29 with top surface 73 of resin material 29 generally level with active surface 25 of semiconductor device 11. This processing takes place in large circular or rectangular panels in a multi-up configuration. Following this encapsulation, a first overlay insulating substrate layer 57 is applied over the active surface 25 of semiconductor device 11 and the top surface 73 of resin material 29. First microvias 75 are formed through the first overlay insulating substrate layer 57 to die pads 23 and optionally, to feed through conductors 77 that may be embedded in the resin material 29. First wiring layer 61 is applied to the first overlay insulating substrate layer 57 and into first microvias 75 and forming first microvia connections 59 to die pads 23 and optionally, to feed through conductors 77. Second overlay insulating substrate layer 63 is applied to first overlay insulating substrate layer 57 and first wiring layer 61. Second microvias 79 are formed in the second overlay insulating substrate layer 63 to portions of first wiring layer 61. Top side wiring layer 67 is applied to the second overlay insulating substrate layer 63 and into second microvias 79 and forming second microvia connections 65 to exposed portions of first wiring layer 61. Additional overlay insulating substrate layers and wiring layers can be applied for as needed for more complex, higher I/O pad count devices. Optionally, the molding resin 29 can be back ground to planarize and/or thin the module.

Fan-Out WLP 70, with its direct metallization to die pads 23 through first microvia connections 59 eliminate 90% of the interconnect parasitics associated with wire bonded fan-out modules and flip chip fan-out modules. The main disadvantages of the Fan-Out WLP is that interconnect defects that cause the Fan-Out WLP overlay structure to be defective, such as for example interconnect shorts or opens or via opens, causes the costly complex semiconductor device to be scrapped along with the interconnect structure, increasing the effective cost of the packaging process.

Despite the advantages of an embedded device module or Fan-Out WLP construction, these construction techniques are more complex, less mature, and higher cost than wire bond and flip chip approaches. One major disadvantage of the embedded device module construction versus the wire bond or flip chip modules is that defects in the overlay interconnect structure can lead to the loss of a complex and costly semiconductor device since the device is committed to the module prior to the fabrication of the build-up interconnect structure. Prior art approaches to address the yield issues associated with embedded device module construction have had limited effects and/or are not applicable to high performance semiconductor devices with high I/O count and high power and ground current requirements.

Accordingly, it would be desirable to provide an electronics packaging technology that permits construction of a high performance, high I/O count microelectronics package, with high interconnect performance and high interconnect and assembly yield.

BRIEF DESCRIPTION OF THE INVENTION

In accordance with one aspect of the invention, an electronics package comprises a multilayer interconnect structure including a plurality of insulating substrate layers, a plurality of conductive wiring layers positioned on the plurality of insulating substrate layers, with each of the plurality of insulating substrate layers having one or more of the plurality of conductive wiring layers positioned thereon, and a plurality of conductive microvias extending through the plurality of insulating substrate layers to electrically connect the plurality of conductive wiring layers, wherein a bottom wiring layer of the plurality of conductive wiring layers includes a plurality of first terminal pads that are positioned on a bottom surface of the multilayer interconnect structure. The electronics package also comprises an electrical component coupled to the bottom surface of the multilayer interconnect structure, the electrical component including a plurality of first input/output (I/O) pads aligned with the plurality of first terminal pads and a plurality of second I/O pads aligned to regions of the multilayer interconnect structure without first terminal pads. The electronics package further comprises a plurality of conductive through vias extending through the multilayer interconnect structure and electrically connected to the plurality of second I/O pads.

In accordance with another aspect of the invention, a method of manufacturing an electronics package includes providing a pre-fabricated multilayer interconnect structure comprising a top surface and a bottom surface, with the multilayer interconnect structure including a plurality of insulating substrate layers each having a plurality of microvias formed therein and a plurality of conductor layers positioned on the plurality of insulating substrate layers and in the plurality of microvias, the plurality of conductor layers comprising a plurality of first terminal pads positioned on the bottom surface of the multilayer interconnect structure. The method also includes coupling an active surface of a semiconductor device to the bottom surface of the multilayer interconnect structure such that a plurality of semiconductor device first input/output (I/O) pads on the active surface are aligned to the plurality of first terminal pads, forming a plurality of through vias that extend from the top surface of the multilayer interconnect structure down to a plurality of semiconductor device second I/O pads on the active surface of the semiconductor device, and forming conductive through vias in the plurality of through vias that contact the plurality of semiconductor device second I/O pads.

In accordance with yet another aspect of the invention, an electronics package comprises a multilayer interconnect structure including a plurality of insulating substrate layers each comprising a plurality of microvias formed therein, a plurality of conductive wiring layers positioned on the plurality of insulating substrate layers such that each of the plurality of insulating substrate layers has one or more conductive wiring layers positioned thereon, and a plurality of conductive microvias in the plurality of microvias to electrically connect the plurality of conductive wiring layers, wherein the plurality of conductive wiring layers and the plurality of conductive microvias are positioned in a perimeter region of the multilayer interconnect structure that surrounds a center region of the multilayer interconnect structure. The electronics package also comprises a semiconductor device attached to a bottom surface of the multilayer interconnect structure, the semiconductor device comprising a plurality of first input/output (I/O) pads aligned with the perimeter region and a plurality of second I/O pads aligned with the center region. The electronics package further comprises a plurality of conductive through vias extending through the multilayer interconnect structure in the center region and electrically connected to the plurality of second I/O pads.

In accordance with still another aspect of the invention, a reconfigured semiconductor device includes a semiconductor device having a plurality of device I/O pads on an active surface thereof, the plurality of device I/O pads comprising first device I/O pads and second device I/O pads. The reconfigured semiconductor device also includes a first redistribution layer on the active surface, the first redistribution layer comprising a first insulating substrate layer, a first plurality of vias formed through the first insulating substrate layer to the plurality of device I/O pads, and a first wiring layer overlying the first insulating substrate layer and extending into the plurality of vias down onto portions of the plurality of device I/O pads, the first wiring layer comprising a plurality of first contact pads connected to the plurality of device I/O pads. The reconfigured semiconductor device further includes an upper redistribution layer overlying the first redistribution layer and comprising an upper insulating substrate layer, a plurality of vias formed through the upper insulating substrate layer to a plurality of contact pads on a wiring layer below the upper insulating substrate layer that comprises the first wiring layer or an additional wiring layer between the first redistribution layer and the upper redistribution layer, and an upper wiring layer overlying the upper insulating substrate layer and extending into the plurality of vias and onto portions of the plurality contact pads on the wiring layer below the upper insulating substrate layer, the upper wiring layer comprising a plurality of upper contact pads connected to a plurality of contact pads on the wiring layer below the upper insulating substrate layer. The upper contact pads comprise first reconfigured device I/O pads and second reconfigured device I/O pads, with each of a plurality of the first reconfigured device I/O pads electrically connected to a single respective first device I/O pad and each of a plurality of the second reconfigured device I/O pads electrically connected to at least two respective second device I/O pads.

In accordance with still another aspect of the invention, an electronics package includes a multilayer interconnect structure comprising a plurality of insulating substrate layers each having a plurality of microvias formed therein and a plurality of conductor layers positioned on the plurality of insulating substrate layers and in the plurality of microvias, wherein the plurality of conductor layers comprises buried conductive via connections embedded in the multilayer interconnect structure. The electronics package also includes an electrical component attached to the multilayer interconnect structure and aligned with the buried conductive via connections, the electrical component comprising a plurality of input/output (I/O) pads. The electronics package further includes a plurality of conductive through vias extending through the multilayer interconnect structure and forming a direct electrical and physical connection with at least a portion of the plurality of I/O pads, wherein the buried conductive via connections are in physical contact with one or more of the plurality of conductive through vias.

In accordance with still another aspect of the invention, an electronics package includes a multilayer interconnect structure comprising a plurality of insulating substrate layers and a plurality of conductor layers positioned on the plurality of insulating substrate layers and extending through a plurality of microvias formed therein. The electronics package also includes an electrical component comprising a plurality of input/output (I/O) pads electrically coupled to the plurality of conductor layers and a plurality of conductive through vias extending through a least two insulating substrate layers of the plurality of insulating substrate layers and electrically connected to at least a portion of the plurality of I/O pads. The plurality of conductor layers further includes a first conductor layer including a ground plane buried in the multilayer interconnect structure, the ground plane forming a direct electrical and physical connection with a respective conductive through via that is electrically connected to a ground I/O pad of the plurality of I/O pads, and includes a second conductor layer including a power plane buried in the multilayer interconnect structure, the power plane forming a direct electrical and physical connection with a respective conductive through via that is electrically connected to a power I/O pad of the plurality of I/O pads.

In accordance with still another aspect of the invention, an electronics package includes a multilayer interconnect structure comprising a plurality of insulating substrate layers and a plurality of conductor layers positioned on the plurality of insulating substrate layers and extending through a plurality of microvias formed therein. The electronics package also includes an electrical component comprising a plurality of input/output (I/O) pads electrically coupled to the plurality of conductor layers and a plurality of conductive through vias extending through at least two insulating substrate layers of the plurality of insulating substrate layers and electrically connected to at least a portion of the plurality of I/O pads. The plurality of conductor layers includes a first conductor layer comprising a partial ground plane buried in the multilayer interconnect structure and forming a direct electrical and physical connection with a respective conductive through via that is electrically connected to a ground I/O pad of the plurality of I/O pads and a partial power plane buried in the multilayer interconnect structure and forming a direct electrical and physical connection with a respective conductive through via that is electrically connected to a power I/O pad of the plurality of I/O pads.

In accordance with still another aspect of the invention, a method of manufacturing an electronics package includes providing a multilayer interconnect structure comprising a plurality of insulating substrate layers each having a plurality of microvias formed therein and a plurality of conductor layers positioned on the plurality of insulating substrate layers and in the plurality of microvias, at least one of the plurality of conductor layers including at least one buried conductive via aperture embedded in the multilayer interconnect structure. The method also includes attaching an active surface of an electrical component to the interconnect structure, forming at least one shoot through via that extends through the at least one buried conductive via aperture down to at least one I/O pad of a plurality of I/O pads on the active surface of the electrical component, and forming a conductive through via in each of the at least one shoot through vias that physically contacts a respective buried conductive via aperture to form at least one buried conductive via connection and that physically contacts a respective I/O pad of the plurality of I/O pads.

In accordance with still another aspect of the invention, an electronics package includes a plurality of insulating substrate layers each having a plurality of microvias formed therein, a plurality of conductor layers positioned on the plurality of insulating substrate layers and in the plurality of microvias, and a plurality of conductive through vias extending through at least two of the plurality of insulating substrate layers. The plurality of conductor layers comprises includes a first conductor layer including a ground plane buried in the electronics package, the ground plane forming a direct electrical and physical connection with a first conductive through via of the plurality of conductive through vias and a second conductor layer including a power plane buried in the electronics package, the power plane forming a direct electrical and physical connection with a second conductive through via of the plurality of conductive through vias.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 3 is a schematic cross-section side view of a prior art multi-device electronics package incorporating embedded device technology.

FIG. 4 is a schematic cross-section side view of a prior art Fan-Out WLP electronics package incorporating embedded device technology.

FIG. 5 is a schematic cross-section side view of a multilayer interconnect structure, according to an embodiment of the invention.

FIG. 6 is a schematic cross-section side view of a first intermediate structure formed after attaching a complex semiconductor device to the multilayer interconnect structure of FIG. 5, according to an embodiment of the invention.

FIG. 7 is a schematic cross-section side view of a second intermediate structure formed after attaching a complex semiconductor device to the multilayer interconnect structure of FIG. 5, according to an embodiment of the invention.

FIG. 8 is a schematic cross-section side view of a third intermediate structure formed after attaching a complex semiconductor device to the multilayer interconnect structure of FIG. 5, according to an embodiment of the invention.

FIG. 13 is a schematic cross-section side view of a seventh intermediate structure formed after attaching a complex semiconductor device to the multilayer interconnect structure of FIG. 5, according to an embodiment of the invention.

FIG. 14 is a schematic cross-section side view of an eighth intermediate structure formed after attaching a complex semiconductor device to the multilayer interconnect structure of FIG. 5, according to an embodiment of the invention.

FIG. 19 is a schematic cross-section side view of a ninth intermediate structure formed after attaching a complex semiconductor device to the multilayer interconnect structure of FIG. 5, according to an embodiment of the invention.

FIG. 20 is a schematic cross-section side view of a tenth intermediate structure formed after attaching a complex semiconductor device to the multilayer interconnect structure of FIG. 5, according to an embodiment of the invention.

FIGS. 23A-23H are schematic cross-section side views of a wafer level process for fabricating one or more reconfigured complex semiconductor devices, according to an embodiment of the invention.

FIG. 24 is a schematic cross-section side view of a multilayer interconnect structure, according to another embodiment of the invention.

FIG. 25 is a cross-section side view of a twelfth intermediate structure formed after attaching a complex semiconductor device to the multilayer interconnect structure of FIG. 24, according to an embodiment of the invention.

FIG. 26 is a schematic cross-section side view of a thirteenth intermediate structure formed after attaching a complex semiconductor device to the multilayer interconnect structure of FIG. 24, according to an embodiment of the invention.

FIG. 27 is a schematic cross-section side view of a fourteenth intermediate structure formed after attaching a complex semiconductor device to the multilayer interconnect structure of FIG. 24, according to an embodiment of the invention.

FIG. 33 is a top view of a portion of a conductor layer of the multilayer interconnect structure of FIG. 24 that includes a partial ground plane and partial power plane, according to an embodiment of the invention FIG. 34 is a schematic cross-section side view of a multilayer interconnect structure, according to another embodiment of the invention.

DETAILED DESCRIPTION

Figure 1:
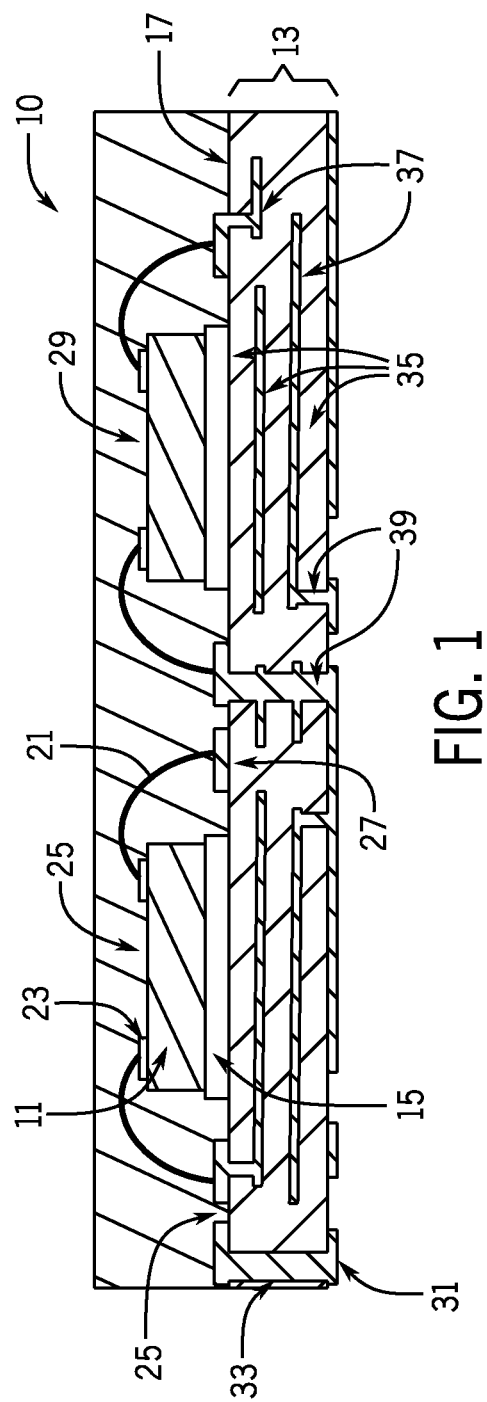
FIG. 1 is a schematic cross-section side view of a prior art multi-device electronics package incorporating wire bonds.
Figure 2:
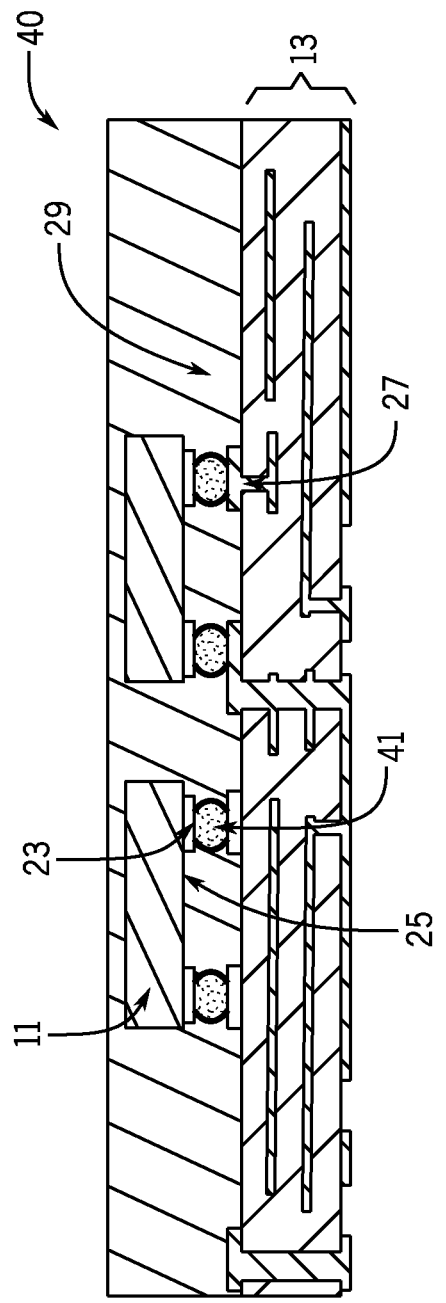
FIG. 2 is a schematic cross-section side view of a prior art multi-device electronics package incorporating solder bumps.

Embodiments of the present invention provide packaging structures with a complex semiconductor device (i.e., "chip") embedded within a molded substrate with a complex interconnect structure overlying and electrically connected to the active surface of the device and that is done with a high yielding process. Specifically, a complex semiconductor device that was been directly attached and electrically interconnected to a multilayer interconnect structure with minimal interconnect processing occurring after the complex semiconductor device is attached to the multilayer interconnect structure. Other embodiments of this invention provide methods for fabricating an embedded device/chip module with a complex semiconductor device that is attached to a pre-fabricated and fully tested multilayer interconnect structure with minimized number of processing steps performed after the complex semiconductor device is attached to the multilayer interconnect structure.

As used herein, the term "complex semiconductor device" refers to a semiconductor die or chip that performs specific functions, such as a microprocessor, a controller, a graphics processor, or an applications processor, as non-limiting examples. These complex semiconductor devices are characterized by high gate count (generally 10's or 100's of millions of gates), high clock rates (1 Gigahertz or more) and high I/O count (100's to 1000's or more). Typically, these complex semiconductor devices contain control lines, address busses, data busses, and clock signals, as well as power and ground pads. On these complex semiconductor devices, generally 50% to 80% or more of their I/O's are power or ground pads in order to minimize the parasitic resistances and reduce voltage drops in the power and ground connections.

Referring now to FIG. 5, a multilayer interconnect structure 100 is illustrated to facilitate understanding of the construction thereof, according to embodiment of the invention. Multilayer interconnect structure 100 is constructed of a plurality of insulating substrate layers 101, 103, 105 and a plurality of conductor layers 102, 104, 106 that provide electrical connections through the insulating substrate layers 101, 103, 105 and electrical connections to the multilayer interconnect structure 100. The plurality of conductor layers 102, 104, 106 are comprised of a plurality of wiring layers 109, 111, 113, 115 (or "traces") and a plurality of conductive microvias 117, 119, 121. In the illustrated embodiment, multilayer interconnect structure 100 is composed of three insulating substrate layers 101, 103, 105 (i.e., core layer 101, upper layer 103, and lower layer 105), four conductive wiring layers 109, 111, 113, 115 (i.e., first patterned wiring layer 109, second patterned wiring layer 111, upper patterned wiring layer 113, and bottom patterned wiring layer 115), and three sets of conductive microvias 117, 119, 121. Alternative embodiments of multilayer interconnect structure 100 may have more or less wiring layers, insulating layers, and conductive microvias than illustrated in FIG. 5 based on the complexity of the circuit function being implemented.

According to various embodiments, insulating substrate layers 101, 103, 105 may be provided in the form of insulating films or dielectric substrates, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples. Alternatively, each of insulating substrate layers 101, 103, 105 may be provided as an organic film provided with an adhesive layer, a self-bonding film, such as, for example, an epoxy-fiber glass pre-preg, or a liquid dispensed dielectric that is cured in place.

The wiring layers 109, 111, 113, 115 and/or conductive microvias 117, 119, 121 may be composed of one or more electrically conductive materials. In an exemplary embodiment, the wiring layers and conductive vias may be composed of a barrier or adhesion layer, a seed layer, and a relatively thick layer of bulk material that is plated atop the seed and barrier layers achieving the desired conductor layer thickness. In alternative embodiments, the barrier layer and/or the seed layer may be omitted from the wiring layers. The barrier layer, when used, is applied to the respective insulating substrate layer 101, 103, 105 prior to application of the seed layer and bulk material. The barrier layer may include titanium or chromium, as non-limiting examples. When used, seed metal layer may be an electrically conductive material such as copper, as one non-limiting example. The layer of bulk material is plated up to achieve the desired thickness of the wiring layers 109, 111, 113, 115, with the bulk material portion of each wiring layer including at least one electrically conductive material such as copper, aluminum, gold, silver, nickel, other standard wiring material, or combinations thereof as nonlimiting examples. However, other electrically conducting materials or a combination of metal and a filling agent may be used in other embodiments. In some embodiments the barrier layer may have a thickness in the approximate range of 0.1 to 0.4 microns, the seed metal layer may have a thickness in the approximate range of 1 to 3 microns and the bulk layer may have a thickness in the approximate range of 10 to 100 microns, with it being recognized that other materials at other thicknesses can be used based on design requirements. Alternatively, wiring layers 109, 111, 113, 115 may be formed of an electrically conductive polymer or formed using inks that contain conductive metal particles.

As depicted in FIG. 5, upper wiring layer 113 contains upper terminal pads 123 that are positioned in pre-determined locations to facilitate electrical connections to an additional interconnect layer or layers (not shown) that might be added after a complex semiconductor device (not shown) is attached to multilayer interconnect structure 100. Bottom wiring layer 115 contains a plurality first lower terminal pads 125 and optionally contains a plurality of second lower terminal pads 127, with the first lower terminal pads 125 and the second lower terminal pads 127 being provided in a perimeter region 128 of multilayer interconnect structure 100. First lower terminal pads 125 are positioned to interconnect to signal I/O pads of complex semiconductor device (not shown) that would be attached to multilayer interconnect structure 100 in assembling a complex microelectronic package or module, as will be explained in greater detail later on. Optional second lower terminal pads 127 (shown in phantom) are positioned to interconnect to lower I/O structures, such as pins, through molding vias, or a substrate structure that could be incorporated into a complex microelectronic package or module. As will be explained in greater detail below, second lower terminal pads 127 are formed/positioned on multilayer interconnect structure 100 so as to be external to or outside of a footprint of the complex semiconductor device that is to be joined to the multilayer interconnect structure 100.

As further depicted in FIG. 5, a center region 129 of multilayer interconnect structure 100 does not have wiring features or upper terminal pads 123 and does not have any first lower terminal pads 125 or second lower terminal pads 127. Center region 129 is preferably reserved for the formation of vias that would connect to I/O pads of a complex semiconductor device after it is attached to multilayer interconnect structure 100. Depending upon the design requirements of a specific complex microelectronic package and the specific I/O pad configuration of a complex semiconductor device, interconnect wiring and layer-to-layer microvias could be incorporated within the center region 129 providing additional circuit functionality. It should be noted that many if not most complex semiconductor devices such as microprocessors, ASICs, and application processors are designed for flip chip attach and have all of their digital I/O pads located in the perimeter region of the chip and reserve the central region of the chip for power and ground I/O pads to facilitate escape routing in the mating substrate.

According to embodiments of the invention, multilayer interconnect structure 100 can be fabricated by any standard industry process used to fabricate a multilayer flex circuit. Preferably, multilayer interconnect structure 100 is fabricated by applying a conductor layer 104 onto/adjacent to the topside of core insulating substrate layer 101. The conductor layer 104 can be a thin composite seed layer such as, for example, titanium:copper with a thickness of 0.5 to 5 microns, and preferably 1-2 microns. Alternatively, the conductor layer 104 can be a metal foil bonded to the core insulating substrate layer 101. Microvias 117 are formed through the core insulating substrate layer 101 exposing portions of the conductor layer 104 by laser ablation, chemical etch, or plasma etch, for example. Depending on the current carrying requirements of the circuit, microvias 117 may have a diameter of about 5 to 100 microns, preferably 10 to 25 microns. Microvias 117 may have diameter outside of this stated range in some embodiments based on alternative design specifications. Conductor layer 104 is also applied onto/adjacent to the bottom surface of the core insulating substrate layer 101, into the microvias 117 and on exposed portions of the first conductor layer. The conductor layer 104 is then patterned to form the first patterned wiring layer 109 and the second patterned wiring layer 111, such as by semi-additive, additive, or subtractive processes, for example.

In fabricating multilayer interconnect structure 100, the upper insulating substrate layer 103 and lower insulating substrate layer 105 are then formed on either side of core insulating substrate layer 101. Upper conductive microvias 119 are formed through upper insulating substrate layer 103 and lower conductive microvias 121 are formed through lower insulating substrate layer 105 in a similar way as the conductive microvias 117 in core insulating substrate layer 101 and are formed to portions of first patterned wiring layer 109 and second patterned wiring layer 111, respectively. Conductor layers 102, 106 are then applied onto/adjacent to the upper surface and lower surface, respectively, of upper insulating substrate layer 103 and lower insulating substrate layer 105 and into microvias 119 and 121, respectively. The conductor layers 102, 106 have a thickness of about 2 to 50 microns, preferably 5 to 20 microns, based upon the electrical requirements of the circuit. However, the thickness of the conductor layers 102, 106 may fall outside of this range in alternative embodiments. The conductor layers 102, 106 are then patterned to form the upper patterned wiring layer 113 and the lower patterned wiring layer 115, respectively, such as by semi-additive, additive, or subtractive processes, for example. In yet other embodiments, either or both of upper patterned wiring layer 113 and the lower patterned wiring layer 115 are formed using a deposition technique such as inkjet printing, screen printing, or dispensing, as non-limiting examples.

Upon completion of such a fabrication process (or a similar fabrication process), a multilayer interconnect structure 100 may thus be provided as a pre-fabricated interconnect structure that does not require any additional via formation, metallization, etc. The pre-fabricated multilayer interconnect structure 100 may be fully tested to ensure proper operability/functionality, so as to prevent committing of a semiconductor device to an interconnect structure with a potential defect. Although the multilayer interconnect structure 100 depicted in FIG. 5 contains the die site for only one electrical component, it should be recognized that multilayer interconnect structure 100 would be formed as a structure containing multiple die sites such as in the form of a large panel containing 10's or 100's of die sites.

Referring now to FIGS. 6-12, a preferred method of forming an embedded electronic module 181 (FIG. 12) is illustrated according to one embodiment of the invention. As described below, the embedded electronic module 181 contains a multilayer interconnect structure 100 overlying a complex semiconductor device 131—with microvia-less electrical connections provided to a plurality of signal I/O pads on the complex semiconductor device 131 and with conductive vias provided that form electrical connections to a plurality of power, ground, and control I/O pads on the complex semiconductor device 131. As indicated above, the multilayer interconnect structure 100 may be provided as a pre-fabricated and pre-tested interconnect structure, so as to avoid committing a high cost complex semiconductor device 131 to a potentially faulty interconnect structure.

FIG. 6 depicts the multilayer interconnect structure 100 of FIG. 5 after an electrical component 131, hereafter referred to as "complex semiconductor device 131," is attached to the outer surface of lower patterned wiring layer 115 and the bottom side of the lower insulating substrate layer 105 using an electrically non-conductive component attach material 133, thereby forming a first intermediate structure 135. According to various embodiments, component attach material 133 is an electrically insulating material that is applied to surrounding components of the multilayer interconnect structure by spin coating, spray coating, meniscus coating, printing, or in film form. Component attach material 133 may be a polymeric material (e.g., epoxy, silicone, liquid crystal polymer, or a ceramic, silica, or metal filled polymer) or other organic material as non-limiting examples. In some embodiments, component attach material 133 is provided on lower insulating layer 105 in either an uncured or partial cured (i.e., B-stage) form. Alternatively, component attach material 133 may be applied to the complex semiconductor device 131 prior to coupling component attach material 133 to lower insulating layer 105.

The complex semiconductor device 131 has a plurality of perimeter I/O device signal pads 137, center I/O device control pads 139, center I/O device power pads 141, and center I/O device ground pads 143. Although complex semiconductor device 131 is depicted in FIGS. 6-12 (and in FIGS. 13-22) as having a small number of I/O pads 137, 139, 141, 143, it should be understood that complex semiconductor device 131 would have hundreds or thousands of I/O pads. The simplified version of complex semiconductor device 131 is depicted here to better understand the structure of these preferred embodiments. Perimeter I/O device signal pads 137 are in positions opposite to first lower terminal pads 125 of multilayer interconnect structure 100.

FIG. 7 depicts the first intermediate structure 135 of FIG. 6 after exposed surfaces of complex semiconductor device 131 and exposed regions of component attach material 133 are encapsulated with molding resin or encapsulant 145, thereby forming a second intermediate structure 147. According to an embodiment, molding resin 145 is an organic resin containing fillers to reduce its Thermal Coefficient of Expansion, which is less than 40 PPM/C or less than 30 PPM/C. Alternatively, molding resin 145 may be a polymer such as, for example, an epoxy material, a pre-preg material, an inorganic material, a composite dielectric material, or any other electrically insulating organic or inorganic material. Optionally, the outer surface 149 of molding resin 145 can be background to expose the back surface 151 of complex semiconductor device 131 and, if desired, back grounding can continue into semiconductor device 131, thinning it along with thinning the molding resin 145. However, with or without backgrinding being performed, molding resin 145 encapsulates at least a portion of the semiconductor device 131, with the sides of the semiconductor device 131 being fully encapsulated in the molding resin 145.

FIG. 8 depicts the second intermediate structure 147 of FIG. 7 after a topside insulating substrate layer 153 is applied to topside surface 155 of multilayer interconnect structure 100, thereby forming a third intermediate structure 157. Topside insulating substrate layer 153 may be provided in the form of insulating films or dielectric substrates, such as for example a Kapton® laminate flex, an organic film, or substrate comprising polyimide, epoxy, BT resin, although other suitable materials may also be employed, such as Ultem®, polytetrafluoroethylene (PTFE), or another polymer film, such as a liquid crystal polymer (LCP) or a polyimide substrate, or inorganic substrates such as Si, SiC, AlN, ceramic, or glass, as non-limiting examples. Alternatively, topside insulating substrate layer 153 may be provided as an organic film provided with an adhesive layer, a self-bonding film, such as, for example, an epoxy-fiber glass pre-preg, or a liquid dispensed dielectric that is cured in place.

Figure 9:
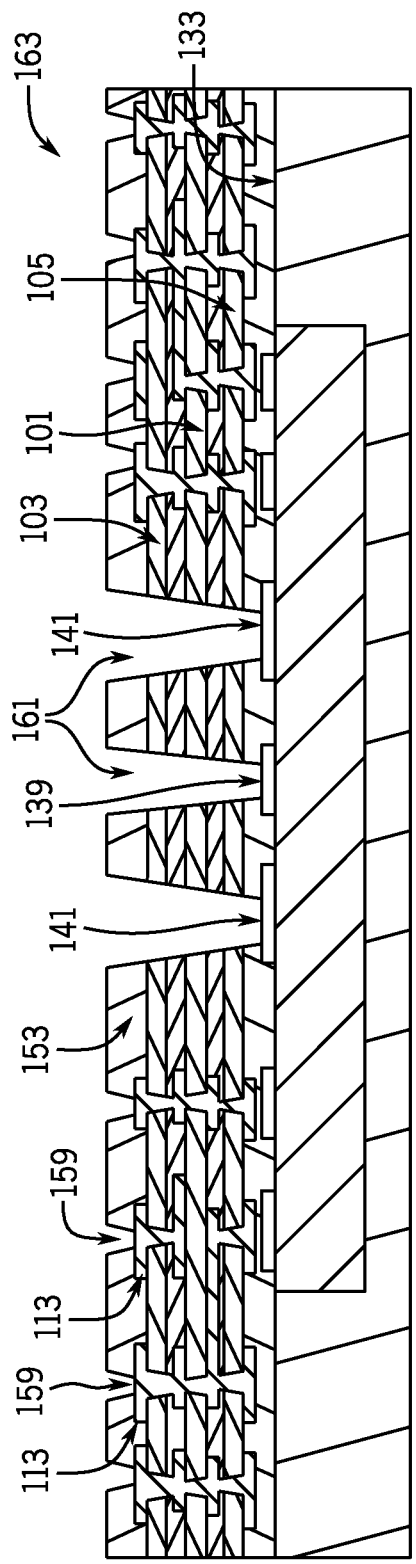
FIG. 9 is a schematic cross-section side view of a fourth intermediate structure formed after attaching a complex semiconductor device to the multilayer interconnect structure of FIG. 5, according to an embodiment of the invention.

FIG. 9 depicts the third intermediate structure 157 of FIG. 8 after microvias 159 are formed in topside insulating substrate layer 153 to portions of upper patterned wiring layer 113 and after through vias 161 are formed through topside insulating substrate layer 153, upper insulating substrate layer 103, core insulating substrate layer 101, lower insulating substrate layer 105, and component attach material 133, and down to center I/O device control pads 139, center I/O device power pads 141, and center I/O device ground pads 143, thereby forming a fourth intermediate structure 163. Microvias 159 and through vias 161 can be formed, for example, by laser ablation, chemical etch, or plasma etch.

Figure 10:
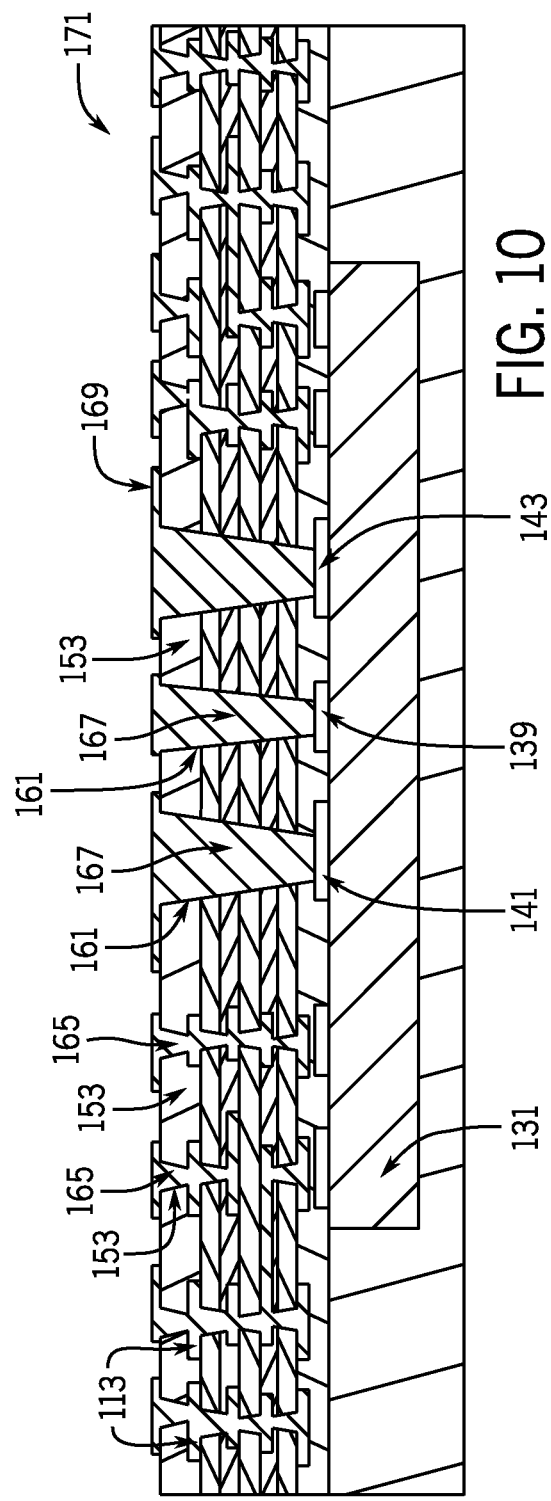
FIG. 10 is a schematic cross-section side view of a fifth intermediate structure formed after attaching a complex semiconductor device to the multilayer interconnect structure of FIG. 5, according to an embodiment of the invention.

FIG. 10 depicts the fourth intermediate structure 163 of FIG. 9 after conductive material is applied to microvias 159, through vias 161, and the outer surface of topside insulating substrate layer 153 to form conductive microvias 165, conductive through vias 167, and a patterned wiring layer 169 (which can alternately be referred to as module contact pads 169 or topside terminal pads 169), thereby forming a fifth intermediate structure 171. Conductive material is applied and patterned on topside insulating substrate layer 153 (to form the wiring layer 169), into microvias 153 and down onto exposed portions of upper patterned wiring layers 113, and into through vias 163 and down onto center I/O device control pads 139, center I/O device power pads 141, and center I/O device ground pads 143 of complex semiconductor device 131. In an exemplary embodiment, the conductive material may be composed of a barrier or adhesion layer, a seed layer, and a relatively thick layer of bulk material that is plated atop the seed and barrier layers achieving the desired wiring layer thickness. In alternative embodiments, the barrier layer and/or the seed layer may be omitted from the wiring layer. The barrier layer, when used, is applied to the topside insulating substrate layer 153 prior to application of the seed layer and bulk material. The barrier layer may include titanium or chromium, as non-limiting examples. When used, seed metal layer may be an electrically conductive material such as copper, as one non-limiting example. The layer of bulk material is plated up to achieve the desired thickness of the wiring layer 169, with the bulk material portion of each wiring layer including at least one electrically conductive material such as copper, aluminum, gold, silver, nickel, other standard wiring material, or combinations thereof as nonlimiting examples. However, other electrically conducting materials or a combination of metal and a filling agent may be used in other embodiments. In some embodiments the barrier layer may have a thickness in the approximate range of 0.1 to 0.4 microns, the seed metal layer may have a thickness in the approximate range of 1 to 3 microns and the bulk layer may have a thickness in the approximate range of 10 to 100 microns, with it being recognized that other materials at other thicknesses can be used based on design requirements. Alternatively, wiring layer 169 may be formed of an electrically conductive polymer or formed using inks that contain conductive metal particles.

The conductive material may be applied by one or more of sputtering, evaporation, electroless plating, electroplating, and pulsed plating. The conductive material can then be patterned to form wiring layer 169, such as by semi-additive, additive, or subtractive processes, for example. In yet other embodiments, patterned wiring layer 169 is formed using a deposition technique such as inkjet printing, screen printing, or dispensing, as non-limiting examples.

Figure 11:
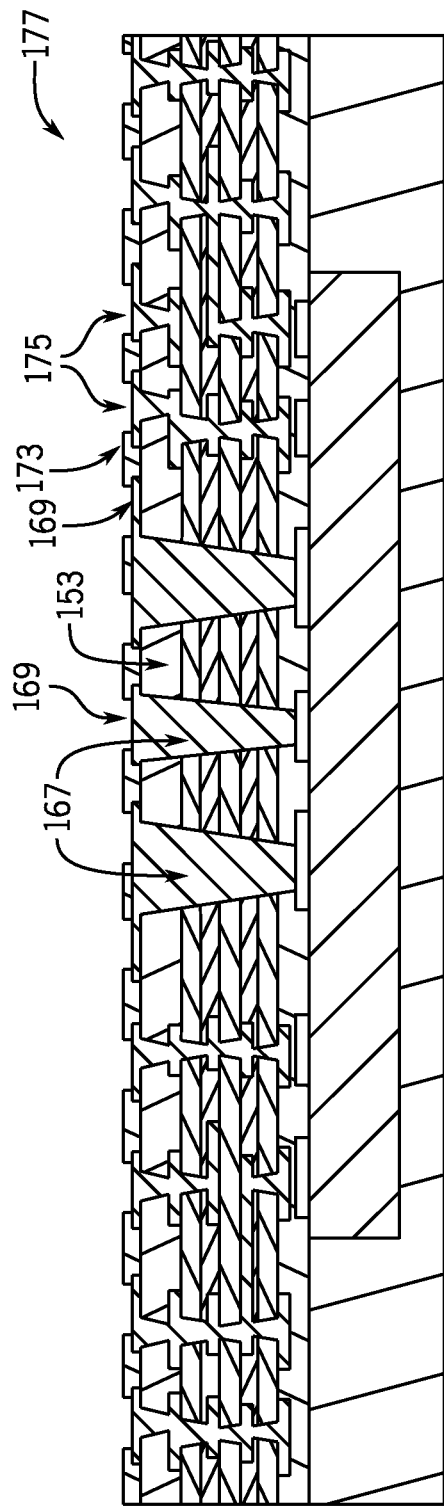
FIG. 11 is a schematic cross-section side view of a sixth intermediate structure formed after attaching a complex semiconductor device to the multilayer interconnect structure of FIG. 5, according to an embodiment of the invention.

FIG. 11 depicts the fifth intermediate structure 171 of FIG. 10 after a topside solder mask 173 is applied to the outer surface of topside insulating substrate layer 153 and patterned wiring layer 169 and after topside solder mask 173 is patterned to form solder mask openings 175 to selected portions of the wiring layer 169, thereby forming a sixth intermediate structure 177. Topside solder mask 173 is preferably an organic resin that is photo-definable and is patterned by exposing the resin to UV light through a mask or through a direct write UV beam.

Figure 12:
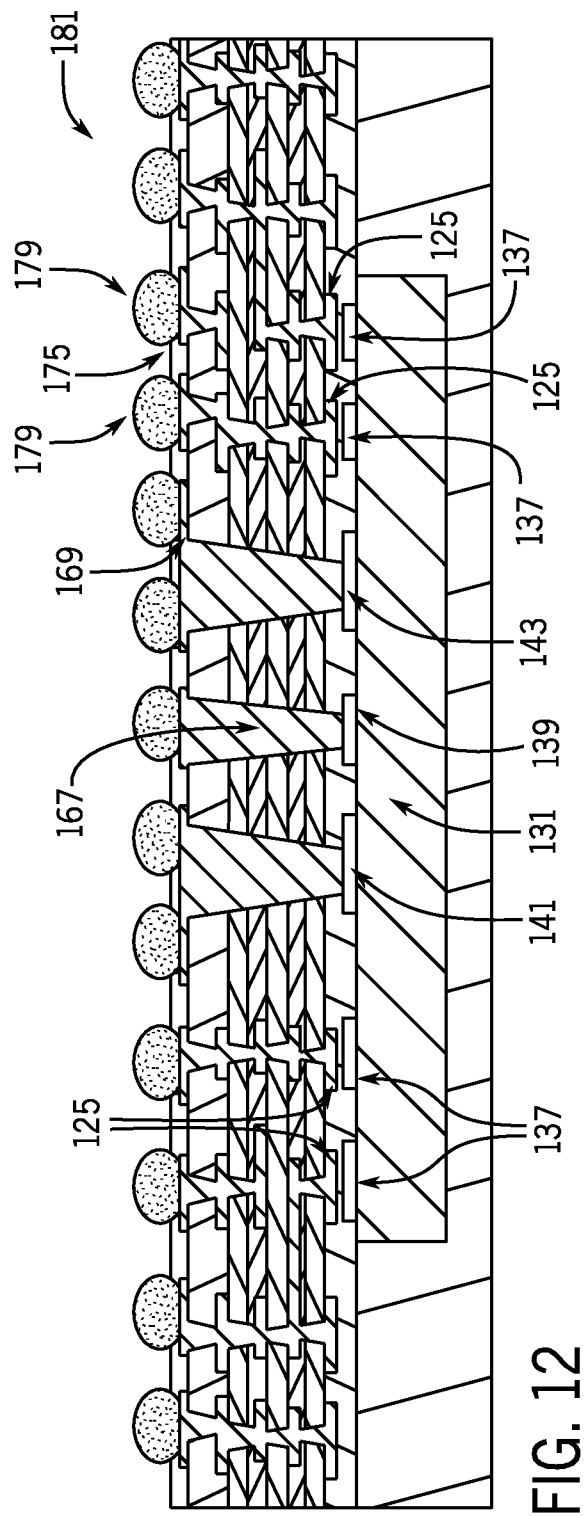
FIG. 12 is a schematic cross-section side view of a first embedded electronics module, according to an embodiment of the invention.

FIG. 12 depicts the sixth intermediate structure 177 of FIG. 11 after package level inputs/outputs (I/Os) 179 (such as solder spheres as illustrated in FIG. 12) are disposed onto solder mask openings 175 on exposed portions of patterned wiring layer 169, thereby forming a first embedded electronics module 181, according to an embodiment of the invention. It is noted that FIG. 12 also depicts an optional feature of this embodiment, where multiple package level I/Os 179 are attached to the same interconnected portions of patterned wiring layer 169 that are tied to I/O device power pads 141 and tied to I/O device ground pads 143, thereby further improving electrical performance by reducing interconnect resistance.

The resulting first embedded electronics module 181 shown in FIG. 12 includes electrical connections between complex semiconductor device 131 and multilayer interconnect structure 100 that are a combination of capacitive coupling and conductive coupling connections. A plurality of signal I/Os of complex semiconductor device 131 represented by perimeter I/O device signal pads 137 are connected by capacitive coupling to first lower terminal pads 125. A plurality of control I/Os of complex semiconductor device 131 represented by center I/O device control pads 139 are electrically connected to multilayer interconnect structure 100 by conductive through vias 167. A plurality of power and ground I/Os of complex semiconductor device 131 represented by center I/O device power pads 141 and center I/O device ground pads 143, respectively, are electrically connected to multilayer interconnect structure 100 by conductive through vias 167.

With regard to the capacitive coupling formed between first lower terminal pads 125 125 and I/O device signal pads 137, the capacitive coupling is achieved due to a small amount of electrically non-conductive component attach material 133 that is present between first lower terminal pads 125 and I/O device signal pads 137 that prevents a direct metallic connection therebetween. For example, a thin layer of component attach material 133 that is approximately 0.5-1.0 micrometers in thickness may be present between first lower terminal pads 125 and I/O device signal pads 137. With regard to the conductive coupling formed between conductive through vias 167 and I/O device control pads 139, I/O device power pads 141, and center I/O device ground pads 143, the conductive through vias 167 are constructed as robust conductive vias of increased dimensions and capable of conducting higher current levels as compared to micro vias 117, 119, 121, which is especially desirable for connection to I/O device power pads 141 and center I/O device ground pads 143. Thus, in preferred embodiments, the cross-sectional area of conductive through vias 167 is at least twice as large as the cross-sectional area of microvias 117, 119, 121, with the cross-sectional areas measured at the midpoints of the conductive through vias 167 and microvias 117, 119, 121. In an alternative embodiment, the cross-sectional area of conductive through vias 167 is at least four times as large as the cross-sectional area of microvias 117, 119, 121. In yet another alternative embodiment, the cross-sectional area of conductive through vias 167 is at least ten times as large as the cross-sectional area of microvias 117, 119, 121.

Figure 15:
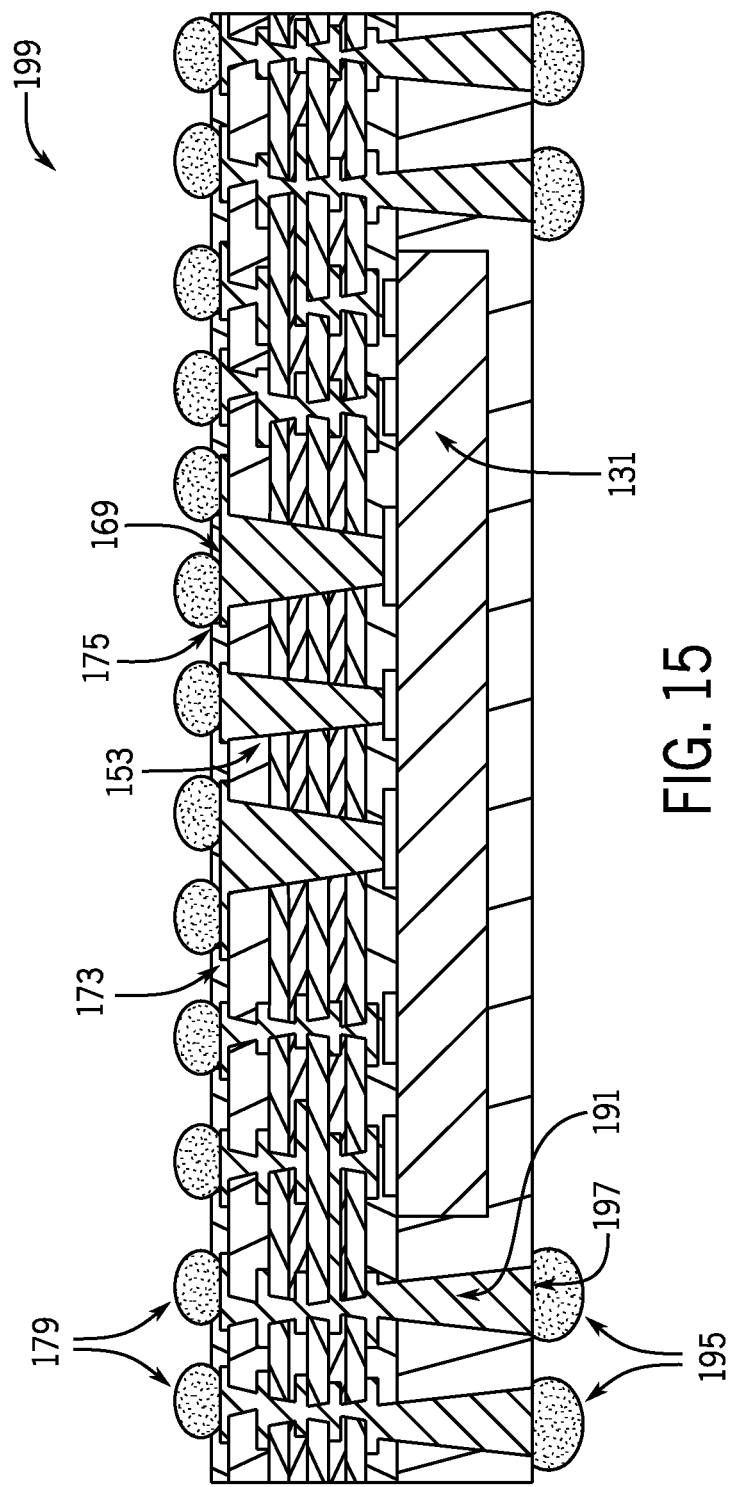
FIG. 15 is a schematic cross-section side view of a second embedded electronics module, according to an embodiment of the invention.

Referring now to FIGS. 13-15, a preferred method of forming an embedded electronic module is illustrated according to another embodiment of the invention, with the embedded electronic module containing through molding conductive vias 191 (FIGS. 14 and 15) along with the multilayer interconnect structure 100 overlying complex semiconductor device 131.

FIG. 13 depicts the fifth intermediate structure 171 of FIG. 10 where, instead of next forming the sixth intermediate structure 177 illustrated in FIG. 11, the fabrication process continues by forming optional through molding openings 183 from the bottom side 185 of molding resin 145, through component attach material 133, and to second lower terminal pads 127, thereby forming a seventh intermediate structure 187. Through molding openings 183 can be formed by laser ablation, plasma etch, or chemical etch, for example. As previously indicated, second lower terminal pads 127 are positioned on multilayer interconnect structure 100 so as to be external to or outside of a footprint of the semiconductor device 131, and thus semiconductor device 131 does not interfere with formation of through molding openings 183.

FIG. 14 depicts the seventh intermediate structure 187 of FIG. 13 after conductive material 189 is disposed into through molding openings 183. The conductive material 189 electrically contacts second lower terminal pads 127 and forms through molding conductive vias 191, thereby forming an eighth intermediate structure 193. Through molding conductive vias 191 provide electrical connections from multilayer interconnect structure 100 to the bottom side 185 of the molding resin 145 to facilitate vertical connection of the embedded electronic module 181.

FIG. 15 depicts the eighth intermediate structure 193 of FIG. 14 after solder mask 173 is applied to the outer surface of topside insulating substrate layer 153 and patterned wiring layer 169 and is patterned to form solder mask openings 175 to selected portions of the patterned wiring layer 169, after solder spheres 179 are disposed onto solder mask openings 175 on exposed portions of patterned wiring layer 169, and after package level inputs/outputs (I/Os) 195 (e.g., solder balls) are disposed on a bottom surface 197 of through molding conductive vias 191, thereby forming a second embedded electronics module 199.

Figure 16:
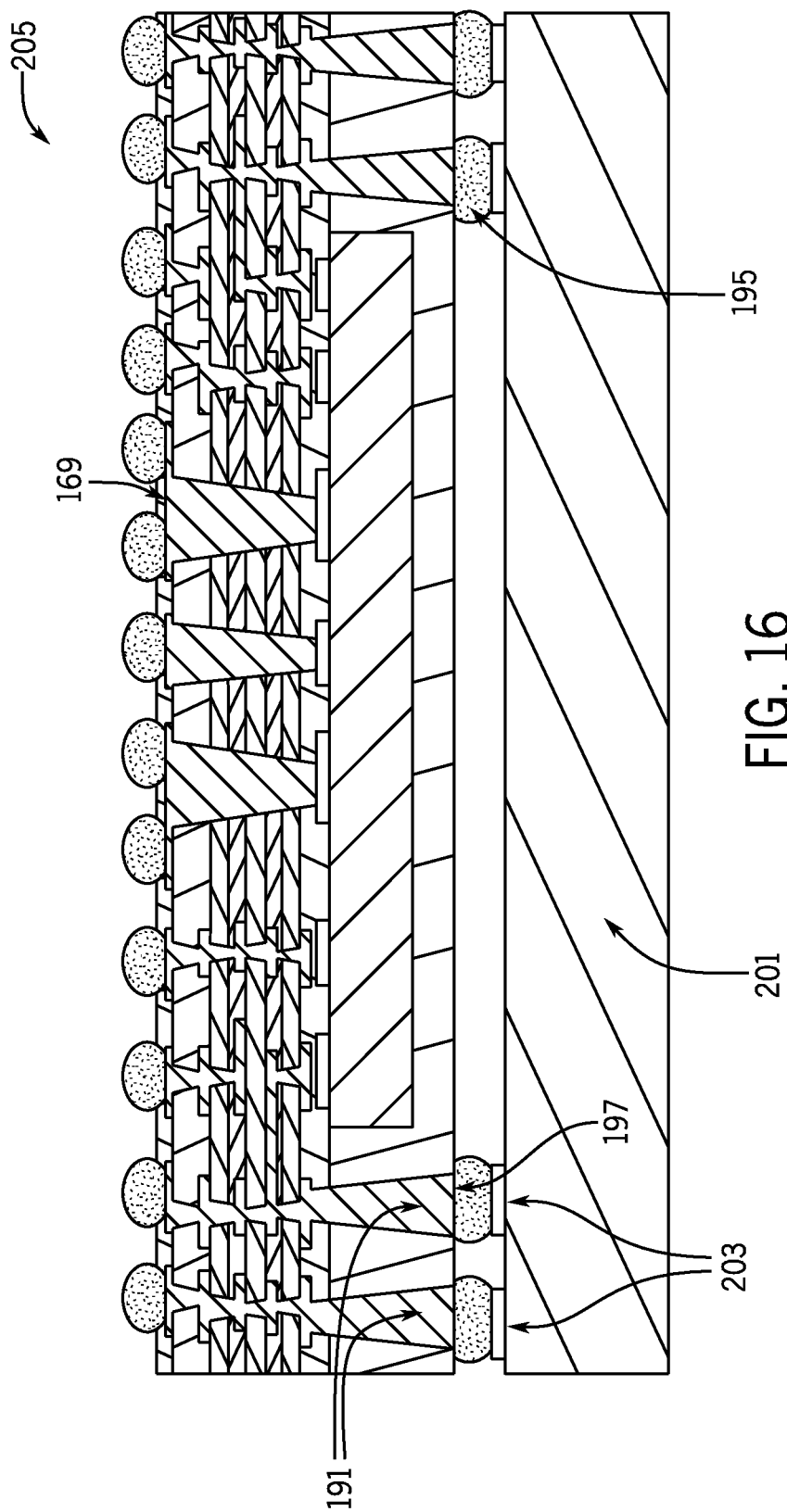
FIG. 16 is a schematic cross-section side view of a package-on-package (PoP) assembly, according to an embodiment of the invention.

As depicted in FIG. 16, the combination of through molding conductive vias 191 and solder balls 195 facilitate the stacking of a second electronics module 201 on top of or under second embedded electronics module 199 of FIG. 15, thereby forming a package-on-package (PoP) assembly. Second electronics module 201 is a packaged microelectronics component with topside terminal pads 203 that are arranged in a perimeter configuration to mirror the bottom surface 197 of through molding conductive vias 191. Solder balls 195 electrically connect the bottom surface 197 of through molding conductive vias 191 to the topside terminal pads 203 of second electronics module 201, forming a first embedded electronics PoP assembly 205.

Figure 17:
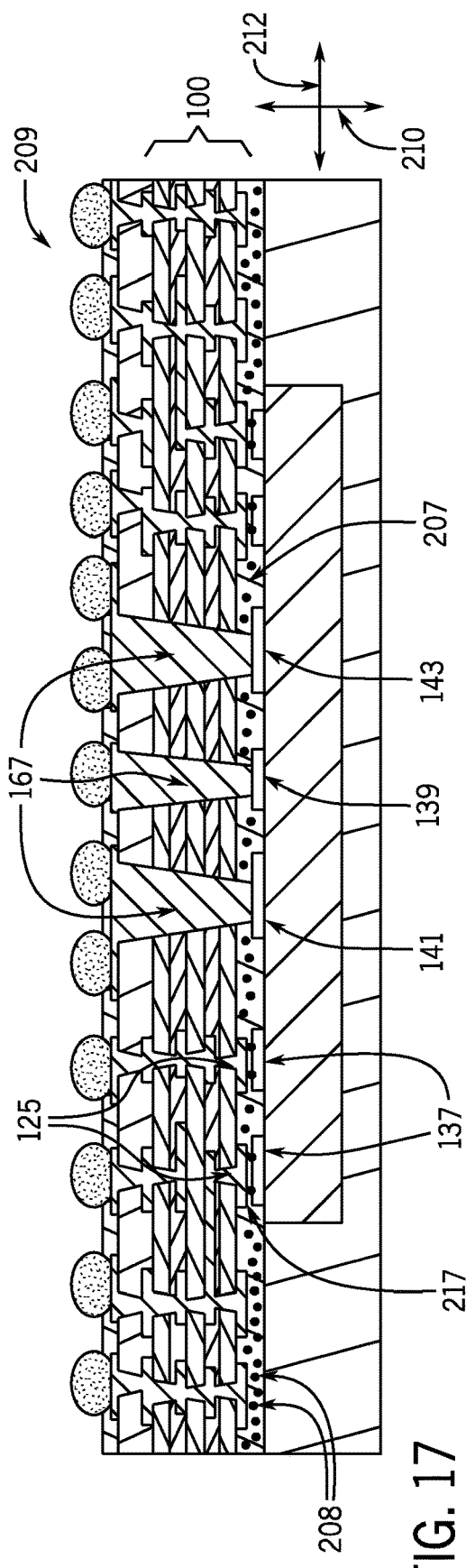
FIG. 17 is a schematic cross-section side view of a third embedded electronics module, according to an embodiment of the invention.

FIG. 17 depicts another preferred embodiment of the invention where a third embedded electronics module 209 identical to that of the first embedded electronics module 181 of FIG. 12 is provided, except that the third embedded electronics module 209 has its device I/O pads 137, 139, 141, 143 electrically connected to the multilayer interconnect structure 100 by a combination of anisotropic conductive adhesive (ACA) and direct metallization. The ACA 207 provides high electrically conductivity in the vertical direction 210 and high electrical isolation in the lateral direction 212. In this embodiment, component attach material 133 (FIG. 12) is replaced with ACA 207, which is composed of an organic resin that includes electrically conductive filler particles 208 therein. According to an exemplary embodiment, the electrically conductive filler particles 208 are in the form of vertically orientated electrically conductive elements, such as carbon nanotubes for example. The density and orientation of the electrically conductive filler particles 208 is such that, when the ACA 207 is cured, the electrically conductive filler particles 208 will provide an electrical path through the organic resin in a vertical direction. The ASA 207 thus electrically connects perimeter I/O device signal pads 137 to first lower terminal pads 125 of multiplayer interconnect structure 100 without providing an electrical short between adjacent perimeter I/O device signal pads 137. Center I/O device control, power, and ground pads 139, 141, 143 of complex semiconductor device 131 are connected to multiplayer interconnect structure 100 by electrically conductive through vias 167 as depicted in first embedded electronic module 181 in FIG. 12, forming the third embedded electronics module 209.

Because ASA 207 provides a direct electrical path from I/O device signal pads 137 to the multilayer interconnect 100, all device signal I/O, control I/O, power I/O, and ground I/O pads 137, 139, 141, 143 could be interconnected to terminal pads 125, 127 on the multilayer interconnect structure 100 and eliminate the need for conductive through vias 167 to connect to power, ground, and control pads 139, 141, 143 of the complex semiconductor device 131. However, it is well known that power and ground pads 141, 143 on high-end semiconductors such as complex semiconductor devices 131 have high current requirements and that they need very low resistivity interconnects from the substrate to the device pads. Indeed, some signal I/O and control I/O, such as a clock signal, may also require low resistivity connections. Typically, signal I/O for data busses and address busses (covering most device signal I/O) have lower current requirements and can be connected with higher resistivity connections. Although each complex semiconductor device 131 has differing design requirements, the highest performance structure of this embodiment is to utilize the ACA 207 to connect to low current I/O device signal pads 137 and conductive through vias 167 for all power, ground, and higher current controls I/O pads 141, 143, 139, as depicted in FIG. 17.

Although not depicted in FIG. 17, it is recognized that through molding conductive vias 191 and solder balls 195 as depicted in FIG. 15 can be added to the third embedded electronics module 209 to form an embedded electronics module that facilitates vertical connection of an electronics module thereto. That is, the addition of through molding conductive vias 191 and solder balls 195 to the third embedded electronics module 209 provides for attachment of a second electronics module to its bottom surface 197 (as depicted in FIG. 16) to form an embedded electronics PoP assembly.

Figure 18:
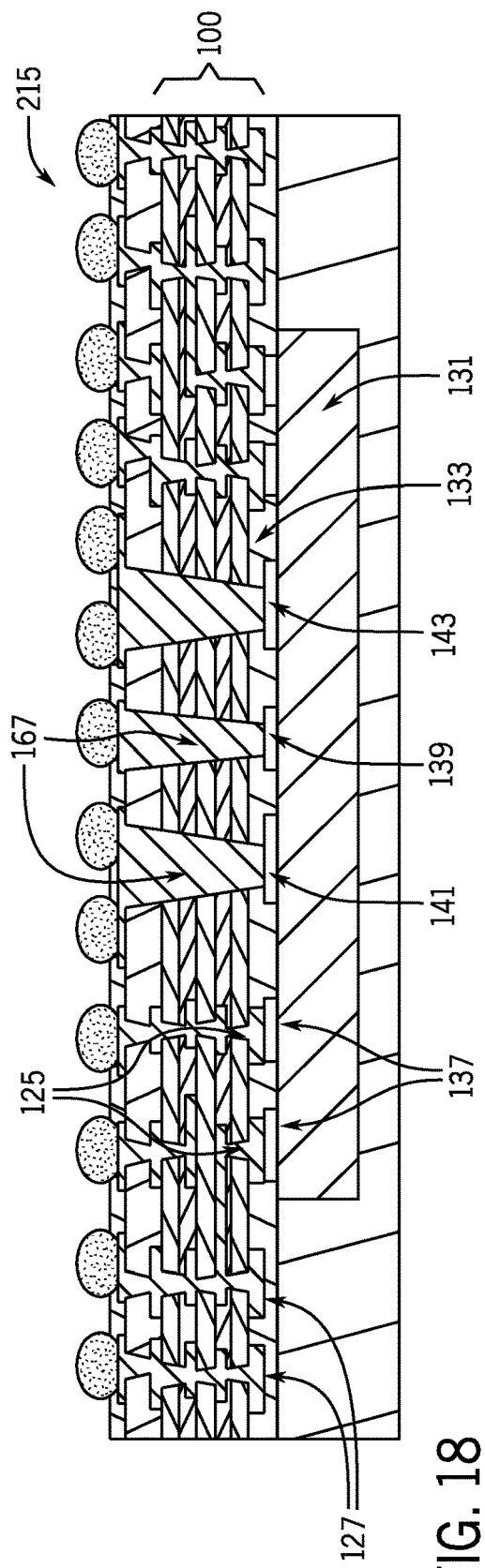
FIG. 18 is a schematic cross-section side view of a fourth embedded electronics module, according to an embodiment of the invention.

Referring now to FIG. 18, another preferred embodiment of the invention is depicted. In FIG. 18, a fourth embedded electronics module 215 is illustrated where device I/O pads 137, 139, 141, 143 are electrically connected to the multilayer interconnect structure 100 by a combination of compression bonding connections and direct metallization using conductive through vias. During curing of non-conductive component attach material 133 that bonds complex semiconductor device 131 to the lower surface of multilayer interconnect structure 100, the adhesive 133 shrinks and is squeezed from a gap (such as gap 217 in FIG. 17) between perimeter I/O device signal pads 137 and first lower terminal pads 125, allowing the perimeter I/O device signal pads 137 and first lower terminal pads 125 to make physical contact and electrically interconnect. First lower terminal pads 125 and second lower terminal pads 127 are formed with a thick metallization layer, such as for example 20 to 40 microns, to facilitate this process. This results in perimeter I/O device signal pads 137 and first lower terminal pads 125 being electrically bonded to each other by compression bonding. Center I/O device control, power, and ground pads 139, 141, 143 of complex semiconductor device 131 are connected to multiplayer interconnect structure 100 by electrically conductive through vias 167 as depicted in first embedded electronic module 181 in FIG. 12, forming fourth embedded electronics module 215. Because thicker first lower terminal pads 125 are in physical contact with perimeter device I/O signal pads 137, all device signal and control I/O pads 137 can be interconnected in perimeter device I/O pads, and the conductive through vias 167 only need to connect to center I/O device power and ground pads 141, 143, simplifying the fabrication process. Although not depicted, through molding conductive vias 191 and solder balls 195 as depicted in FIG. 15 can be added to fourth embedded electronics module 215 to form an embedded electronics module that facilitates vertical connection of an electronics module thereto. That is, the addition of through molding conductive vias 191 and solder balls 195 to the fourth embedded electronics module 215 provides for attachment of a second electronics module to its bottom surface 197 (as depicted in FIG. 16) to form an embedded electronics PoP assembly.

Referring now to FIGS. 19-22, another preferred embodiment of the invention is depicted. In FIGS. 19-22, build-up of a fifth embedded electronics module is illustrated that has perimeter I/O device signal pads 137 of complex semiconductor device 131 connected to first lower terminal pads 125 of the multilayer interconnect structure 100 via a localized conductive adhesive or solder. Referring first to FIG. 19, the multiplayer interconnect structure 100 of FIG. 5 is depicted after non-conductive component attach material 133 is applied to the bottom surface of multiplayer interconnect structure 100, with portions of first lower terminal pads 125 being free of component attach material 133, thereby forming ninth intermediate structure 223. According to embodiments of the invention, component attach material 133 can be applied, for example, by screen printing or stencil printing just to the bottom side of the lower insulating substrate layer 105 or can be applied over the outer surface of lower patterned wiring layer 115 and the bottom side of the lower insulating substrate layer 105 (e.g., such as by spin coating, spray coating, or meniscus coating) and then patterned by, for example, laser ablation or by photopatterning with UV light exposure.

Figure 21:
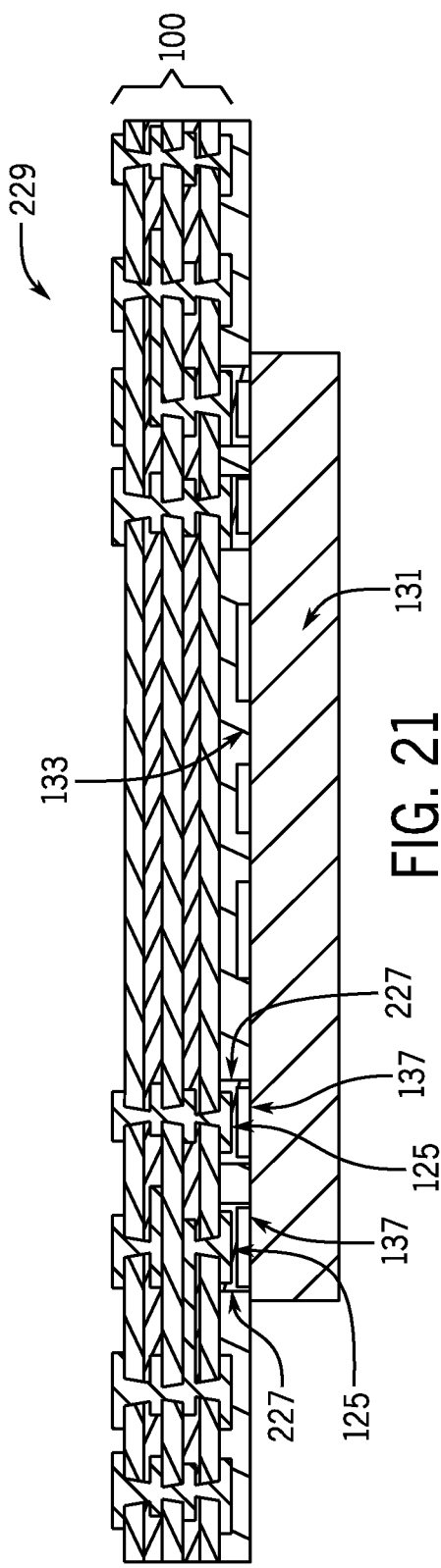
FIG. 21 is a schematic cross-section side view of an eleventh intermediate structure formed after attaching a complex semiconductor device to the multilayer interconnect structure of FIG. 5, according to an embodiment of the invention.

FIG. 20 depicts the ninth intermediate structure 223 of FIG. 19 after a conductive adhesive 227 has been applied to exposed portions of first lower terminal pads 125, thereby forming a tenth intermediate structure 225. Conductive adhesive 227 can be applied for example by screen printing, stencil printing, or ink jetting. FIG. 21 depicts the tenth intermediate structure 225 of FIG. 20 after complex semiconductor device 131 is bonded to the bottom surface of multilayer interconnect structure 100, thereby forming an eleventh intermediate structure 229. Perimeter I/O device signal pads 137 of complex semiconductor device 131 are electrically connected to first lower terminal pads 125 of the multilayer interconnect structure 100 by the localized conductive adhesive 227. While the use of conductive adhesive 227 is described above, it is recognized that an alternative embodiment could alternatively use solder paste instead of conductive adhesive—with the solder paste being applied to exposed portions of first lower terminal pads 125 to electrically connect the perimeter I/O device signal pads 137 to first lower terminal pads 125, thereby forming tenth intermediate structure 225.

Figure 22:
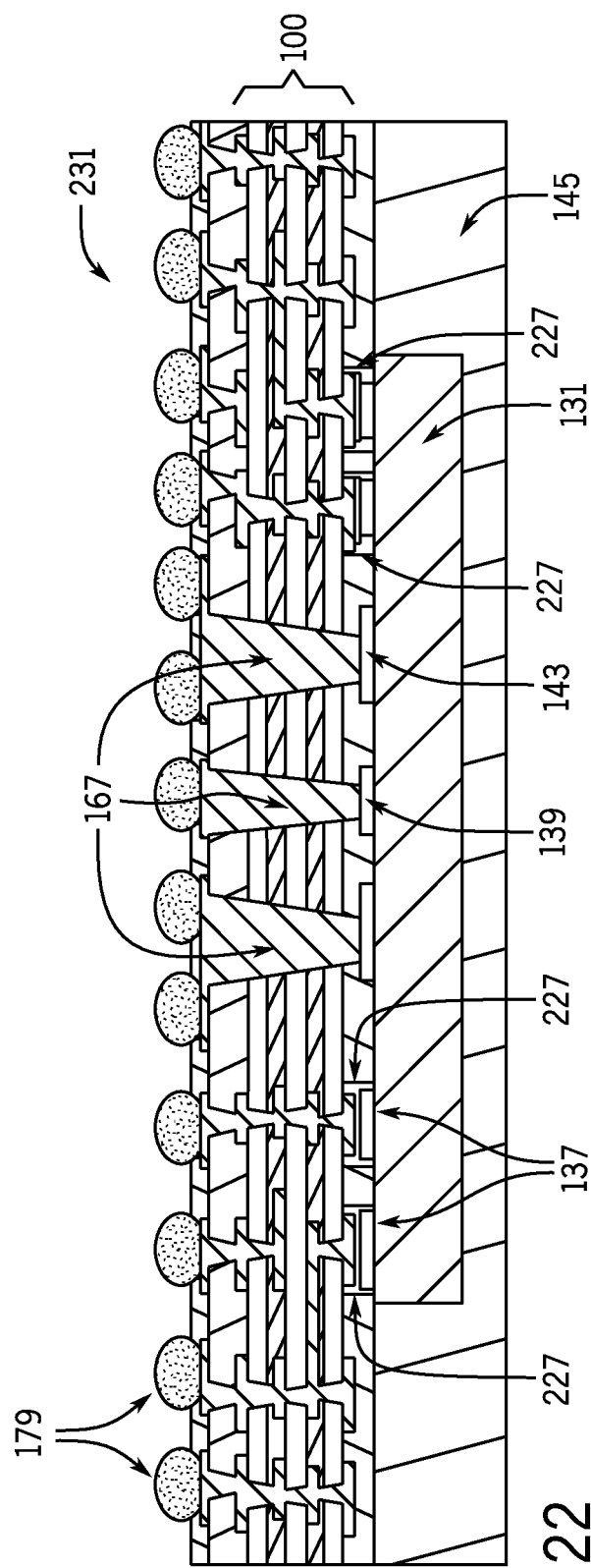
FIG. 22 is a schematic cross-section side view of a fifth embedded electronics module, according to an embodiment of the invention.

FIG. 22 depicts the eleventh intermediate structure 229 of FIG. 21 after molding resin 145 is applied to its lower surface, thereby encapsulating complex semiconductor device 131. As illustrated, conductive through vias 167 are formed down through multilayer interconnect structure 100 and component attach material 133 to electrically connect to center I/O device control, power and ground pads 139, 141, 143. Topside solder spheres 179 are mounted onto the topside of multilayer interconnect structure 100, thereby forming fifth embedded electronics module 231. In this embodiment, all I/O device pads 137, 139, 141, 143 of the complex semiconductor device 131 are electrically connected to conductive features of multilayer interconnect structure 100. Although not depicted, through molding conductive vias 191 and solder balls 195 as depicted in FIG. 15, can be added to fifth embedded electronics module 231 to form an embedded electronics module that facilitates vertical connection of an electronics module thereto. That is, the addition of through molding conductive vias 191 and solder balls 195 to the fifth embedded electronics module 231 provides for attachment of a second electronics module to its bottom surface 197 (as depicted in FIG. 16) to form an embedded electronics PoP assembly.

Referring now to FIGS. 23A-23H, wafer level processing of a semiconductor wafer 300 containing a plurality of complex semiconductor devices 131 is depicted that targets redistributing the device I/O pads to facilitate incorporating these devices into the various embodiments of the invention described in the preceding paragraphs and illustrated in FIGS. 5-22, according to another preferred embodiment of this invention. Although FIGS. 23A-23H depict a cross-section of a device with twelve (12) I/O pads across its surface, and having a total of 144 I/O pads in a full 12×12 area array configuration, it is recognized that a typical complex semiconductor device would have hundreds or thousands of I/O pads. Thus, it is to be understood that the complex semiconductor device(s) depicted in FIGS. 23A-23H with fewer I/O pads is for purposes of clarity and facilitating better understanding of the invention.

Referring first to FIG. 23A, a simplified version of a portion of a complex semiconductor wafer 300 containing multiple complex semiconductor die sites 301 is provided, with FIG. 23A depicting one die site 301. The die site 301 includes a plurality of device I/O pads 303 comprising multiple signal pads 305 located in the perimeter region and one signal pad 305 located in the central region, and at least one control pad 307, multiple power pads 309, and multiple ground pads 311 all located in the central region. Although typical complex semiconductor dies have most of their signal I/O pads 305 located on the die perimeter region, complex semiconductor dies can have one or more signal I/O pads 305 located in the central region of the die.

Figure 23C:
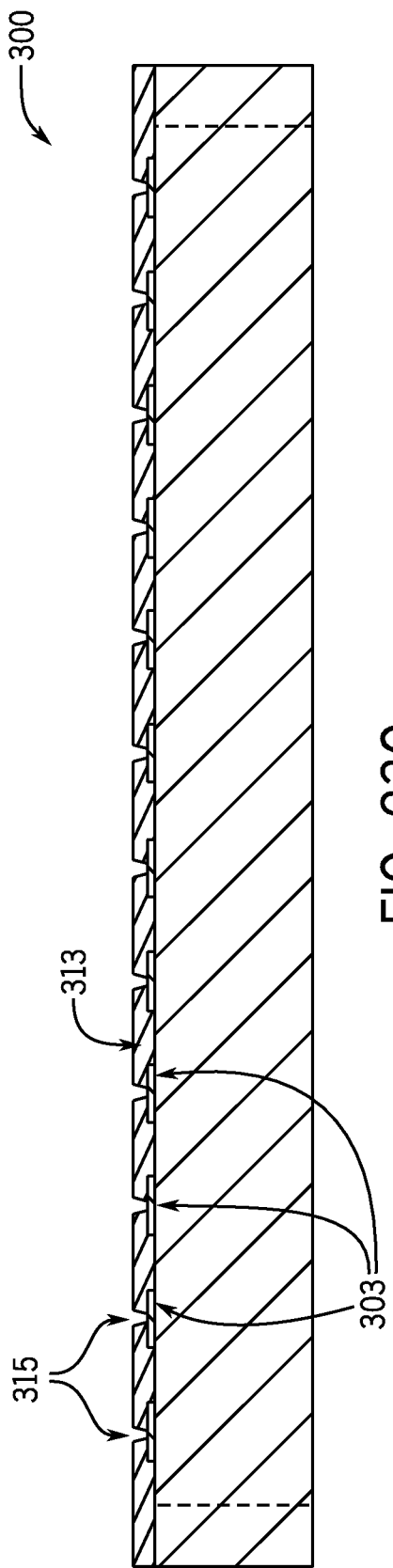
Figure 23D:
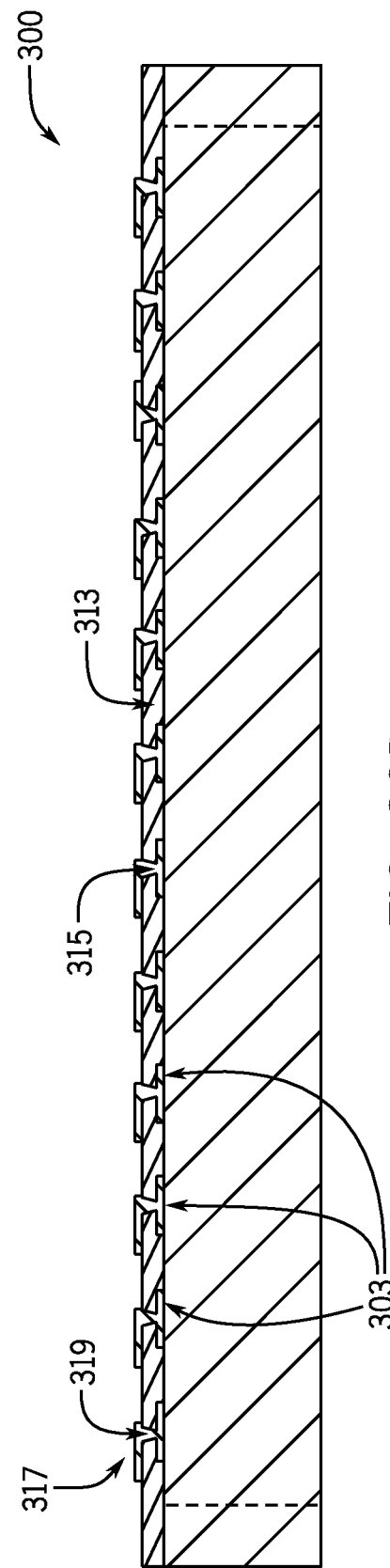

FIG. 23B depicts the complex semiconductor wafer 300 of FIG. 23A after a first on-wafer insulating substrate layer 313 is dispensed on the wafer top surface. The on-wafer insulating substrate layer 313 may be comprised of an organic resin, polyimide, epoxy, or liquid crystal polymer and may be applied by spin coating, spray coating, or meniscus coating, for example. According to embodiments, the first on-wafer insulating substrate layer 313 may have a thickness of 1 to 20 microns and preferably of 2 to 10 microns. FIG. 23C depicts the complex semiconductor wafer 300 of FIG. 23B after microvias 315 are formed through first on-wafer insulating substrate layer 313 to a plurality of device I/O pads 303. The microvias 315 may be formed by a photo-patterning of the first on-wafer insulating substrate layer 313, with the insulating substrate layer being patterned by UV light exposure or laser ablation, for example. FIG. 23D depicts the complex semiconductor wafer 300 of FIG. 23C after a conductive material is dispensed on the outer surface of first on-wafer insulating substrate layer 313 and into microvias 315 and onto exposed portions of a plurality of device I/O pads 303 and subsequently patterned, so as to form a conductive interconnect layer 317 (i.e., "patterned conductive layer 317") on the outer surface of on-wafer insulating substrate layer 313 and conductive microvias 319. The conductive material may be applied by one or more of electroless plating, sputtering, evaporation and electroplating or by one of subtractive patterning and semi-additive patterning.

Figure 23E:
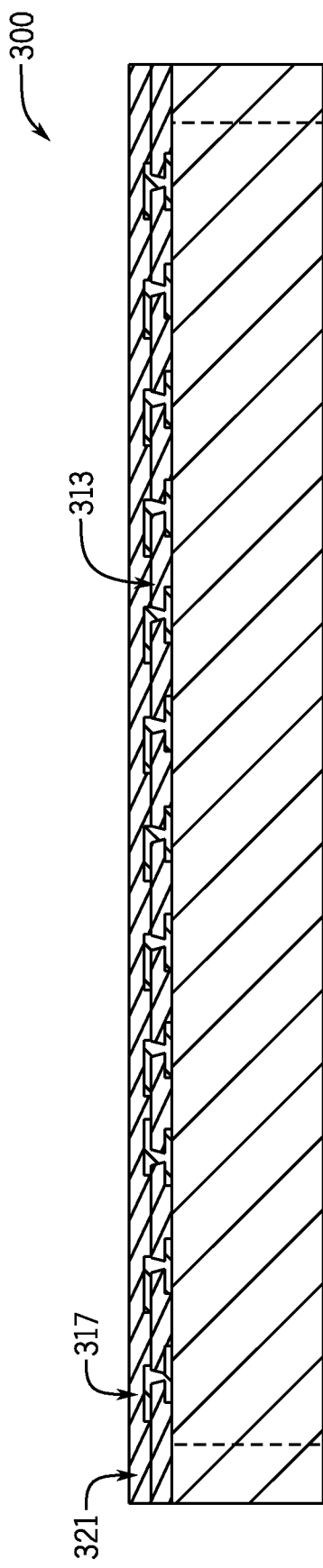
Figure 23F:
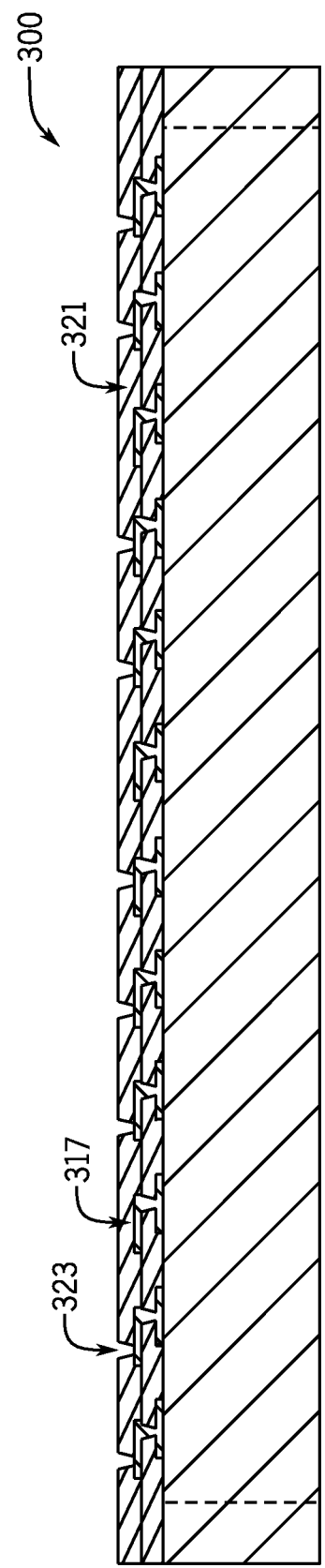
Figure 23G:
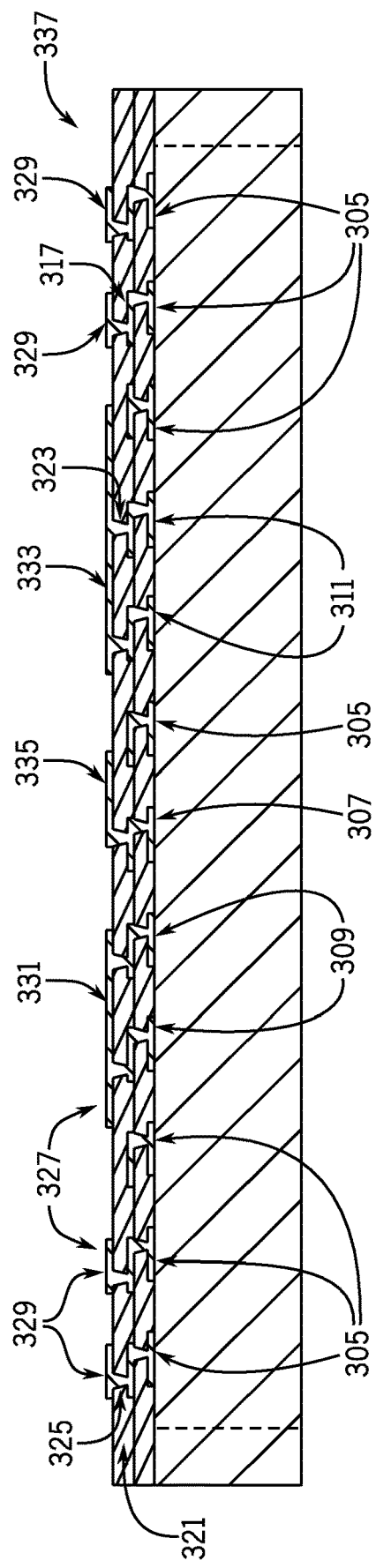
Figure 23H:
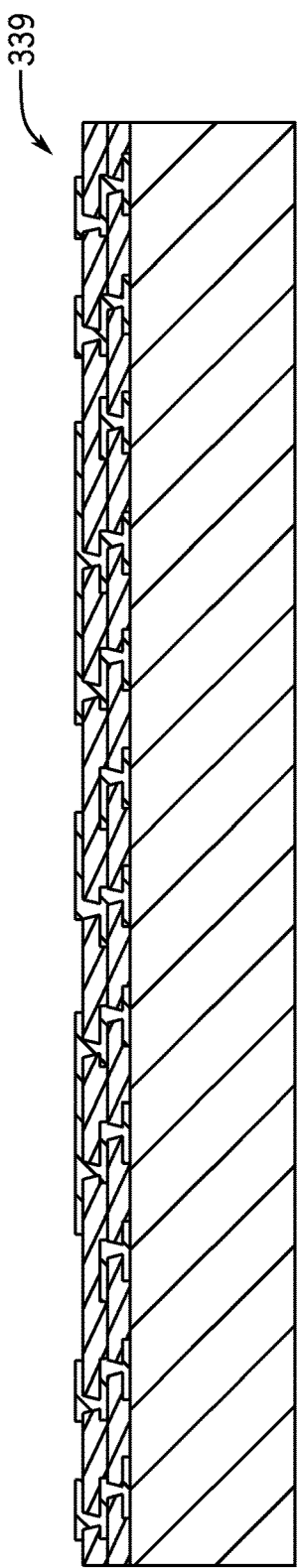

FIG. 23E depicts the complex semiconductor wafer 300 of FIG. 23D after a second on-wafer insulating substrate layer 321 is dispensed on the top surface of the first on-wafer insulating substrate layer 313 and on patterned conductive layer 317. According to embodiments, the second on-wafer insulating substrate layer 321 may have a thickness of 1 to 20 microns and preferably of 2 to 10 microns. FIG. 23F depicts the complex semiconductor wafer 300 of FIG. 23E after second microvias 323 are formed through second insulating substrate layer 321 to a plurality of locations on patterned conductive layer 317. FIG. 23G depicts the complex semiconductor wafer 300 of FIG. 23F after a conductive material is dispensed on the outer surface of second on-wafer insulating substrate layer 321 and into second microvias 323 and onto exposed portions of a plurality of locations on patterned conductive layer 317 and subsequently patterned to form second conductive microvias 325 and redistributed I/O pads 327, with the redistributed I/O pads 327 including reconfigured device I/O signal pads 329, reconfigured device I/O power pads 331, reconfigured device I/O ground pads 333, and at least one reconfigured device I/O control pad 335. A reconfigured complex semiconductor die site 337 is thereby formed. FIG. 23H depicts the reconfigured complex semiconductor die site 337 of FIG. 23G after it is singulated from complex semiconductor wafer 300 forming reconfigured complex semiconductor chip 339.

According to one embodiment, the number of reconfigured device I/O signal pads 329 may thus be approximately equal to the number of device I/O signal pads 305 and the number of reconfigured device I/O power pads 331 and reconfigured device I/O ground pads 333 may be less than or equal to half of the number of device I/O power pads 309 and device I/O ground pads 311. As depicted in FIGS. 23A-23H, device I/O signal pads 305 are redistributed to perimeter regions of the reconfigured complex semiconductor device 331, with each device I/O signal pad 305 routed to a corresponding reconfigured device I/O signal pad 329. Multiple device I/O power pads 309 are redistributed to a center portion of reconfigured complex semiconductor device 339, with multiple device I/O power pads 309 routed to common reconfigured device I/O power pads 331 to form a conductive plate region—i.e., each reconfigured device I/O power pad 331 is electrically connected to at least two device I/O power pads 309. The reconfigured device I/O power pads 331 are preferably larger than the device I/O pads 303 and larger than the reconfigured device I/O signal pads 329. Multiple device I/O ground pads 311 are redistributed to a center portion of reconfigured complex semiconductor device 339, with multiple device I/O ground pads 311 routed to common reconfigured device I/O ground pads 333 to form a conductive plate region—i.e., each reconfigured device I/O ground pad 333 is electrically connected to at least two device I/O ground pads 311. The reconfigured device I/O ground pads 333 are preferably larger than the device I/O pads 303 and larger than the reconfigured device I/O signal pads 329. At least one device I/O control pad is 307 redistributed to a center portion of reconfigured complex semiconductor device 339, with each device I/O control pad 307 routed to a corresponding reconfigured device I/O control pad 335. The at least one reconfigured device I/O control pad 335 is preferably larger than the device I/O pads 303 and larger than the reconfigured device I/O signal pads 329. According to one embodiment, a size of the reconfigured device I/O power pads 331, reconfigured device I/O ground pads 333, and reconfigured device I/O control pad 335 is twice the size of the reconfigured device I/O signal pads 329. The reconfigured complex semiconductor device 339 of FIG. 23H can be used to replace complex semiconductor device 131 depicted in FIGS. 6-18, 21, and 22.

Referring now to FIG. 24, a multilayer interconnect structure 400 is depicted that is similar to multilayer interconnect structure 100 depicted in FIG. 5, with multilayer interconnect structure 400 representing another embodiment of the invention. Similar to multilayer interconnect structure 100, multilayer interconnect structure 400 includes three insulating substrate layers 401, 403, 405 (i.e., core layer 401, upper layer 403, and lower layer 405), four patterned wiring layers 409, 411, 413, 415 (i.e., first patterned wiring layer 409, second patterned wiring layer 411, upper patterned wiring layer 413, and bottom patterned wiring layer 415), and three sets of insulating substrate layer conductive microvias 417, 419, 421, although it is recognized that multilayer interconnect structure 400 may have fewer interconnect layers or more interconnect layers as determined by the complexity of the circuit function being implemented. Upper wiring layer 413 contains upper terminal pads 423 that are positioned in pre-determined locations for additional interconnect layer(s) that might be added after a complex semiconductor device (not shown) is attached to multilayer interconnect structure 400. Bottom wiring layer 415 contains a plurality of first lower terminal pads 425 and optionally contains a plurality of second lower terminal pads 427. First lower terminal pads 425 are positioned to interconnect to signal I/O pads of the complex semiconductor device that would be attached to multilayer interconnect structure 400 in assembling a complex microelectronic package or module. Optional second lower terminal pads 427 are positioned to interconnect to lower I/O structures such as pins, through molding vias, or a substrate structure that could be incorporated into a complex microelectronic package or module.

As shown in FIG. 24, multilayer interconnect structure 400 differs from multilayer interconnect structure 100 (FIG. 5) in that multilayer interconnect structure 400 includes conductive features in the center region 429 of multilayer interconnect structure 400. In the embodiment of FIG. 24, patterned conductor layers 409 and 411 define buried conductive via connections 409a and 411a that are used to assist in the formation of through vias 461 depicted later in FIG. 26. According to an exemplary embodiment, conductive via connections 409a and 411a are in the form of cover pads or intra-layer via connections that include an aperture formed therein in order to provide for the formation of through vias (i.e., "shoot-through vias") that assist in via formation accuracy, speed, and yield. In another embodiment, patterned conductor layers 409 and 411 may define buried conductive power and ground planes 409b, 411b (see FIGS. 32A-32E), respectively, in the interconnect structure 400. The power and ground planes may be formed of copper foil or another similar metallic conductor. For example, as previously described, a conductor layer may be formed that is composed of a barrier or adhesion layer, a seed layer, and a layer of bulk material that is plated atop the seed and barrier layers achieving the desired conductor layer thickness, as previously described. The barrier layer may include titanium or chromium, while the seed metal layer may include copper and the layer of bulk material may include at least one electrically conductive material such as copper, aluminum, gold, silver, nickel, or combinations thereof. Other electrically conducting materials or a combination of metal and a filling agent may be used in other embodiments, such as an electrically conductive polymer or inks that contain conductive metal particles. The buried conductive power and ground planes may be structured to cover most of the surface/plane of interconnect structure 400 on which they are formed, or may over overly desired sections/portions of the surface/plane of interconnect structure 400 on which they are formed (i.e., "partial" power and ground planes). The power and ground planes may be formed as mostly continuous features/layers or as segmented features divided into different areas that are isolated from one another. The ground plane is connected to a power supply ground terminal (not shown) and serves as a return path for current from different circuits/components (i.e., complex semiconductor device) packaged with the interconnect structure in an embedded electronics module. The power plane is the counterpart to the ground plane and behaves as an AC signal ground plane while providing DC power to the circuits/components (i.e., complex semiconductor device) packaged with the interconnect structure in an embedded electronics module. Additionally, each of the ground and power planes may serve to provide electromagnetic interference (EMI) shielding to the semiconductor device 431.

Referring now to FIGS. 25-27, build-up steps for forming an embedded electronics module are illustrated where a complex semiconductor device is attached and electrically connected to multilayer interconnect structure 400. Referring first to FIG. 25, the multilayer interconnect structure 400 of FIG. 24 is depicted after a complex semiconductor device 431 is bonded to the lower surface of multilayer interconnect structure 400 via component attach material 433 and after exposed surfaces of complex semiconductor device 431 and exposed regions of component attach material 433 are encapsulated with molding resin 445, thereby forming a twelfth intermediate structure 460. Complex semiconductor device 431 is placed on the bottom surface of multilayer interconnect structure 400, with the complex semiconductor device 431 perimeter I/O device signal pads 437 aligned to first lower terminal pads 425 of multilayer interconnect structure 400. In addition, center I/O device power pads 441 and center I/O device ground pads 443 are aligned to conductive via connections 409a and 411a.

FIG. 26 and depicts twelfth intermediate structure 460 of FIG. 25 after microvias 459 are formed in topside insulating substrate layer 453 to portions of upper patterned wiring layer 413 and through vias 461, 461a, 461b are formed through topside insulating substrate layer 453, upper insulating substrate layer 403, core insulating substrate layer 401, lower insulating substrate layer 405 and component attach material 433 to center I/O device control pads 439, center I/O device power pads 441, and center I/O device ground pads 443, thereby forming thirteenth intermediate structure 470. Through vias 461a are formed through openings 475 in patterned conductor layer 411 and through vias 461b are formed through openings 473 in patterned conductor layer 409 to more precisely control the location of through vias 461a, 461b.

FIG. 27 depicts thirteenth intermediate structure 470 of FIG. 26 after conductive material is applied to microvias 459, through vias 461, 461a, 461b and the outer surface of topside insulating substrate layer 453, so as to form solid conductive microvias 465, conductive through vias 467, 467a, 467b and patterned conductor or wiring layer 469, thereby forming fourteenth intermediate structure 480. Respective conductive through vias 467b, 467a make electrical contact with patterned conductor layer 409 and patterned conductor layer 411, thereby providing direct electrical connection with power and ground buried conductive planes provided by conductor layers 409 and 411.

Figure 28:
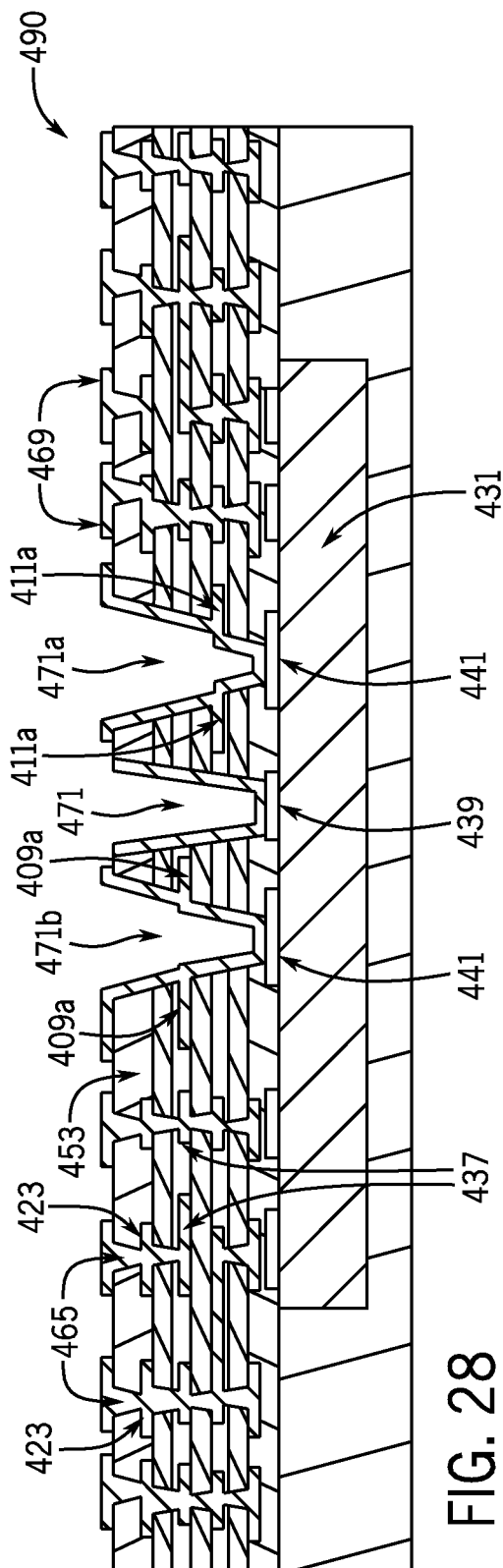
FIG. 28 is a schematic cross-section side view of a fifteenth intermediate structure formed after attaching a complex semiconductor device to the multilayer interconnect structure of FIG. 24, according to an embodiment of the invention.

FIG. 28 is similar to FIG. 27 and represents yet another embodiment of the invention. It depicts thirteenth intermediate structure 470 of FIG. 26 after conductive material is applied to microvias 459, to the side walls of through vias 461, 461a, 461b and to the outer surface of topside insulating substrate layer 453, so as to form conductive microvias 465, conformal conductive through vias 471, 471a, 471b and patterned wiring layer 469, thereby forming fifteenth intermediate structure 490. Fifteenth intermediate structure 490 has lower current carrying capability due to its conformal conductive through vias 471, 471a, 471b for power and ground connections versus the solid conductive through vias 467, 467a, 467b and would be limited to lower power dissipation devices. The conformal conductive through vias 471, 471a, 471b require less plating to form and would have greater mechanical flexibility.

Figure 29:
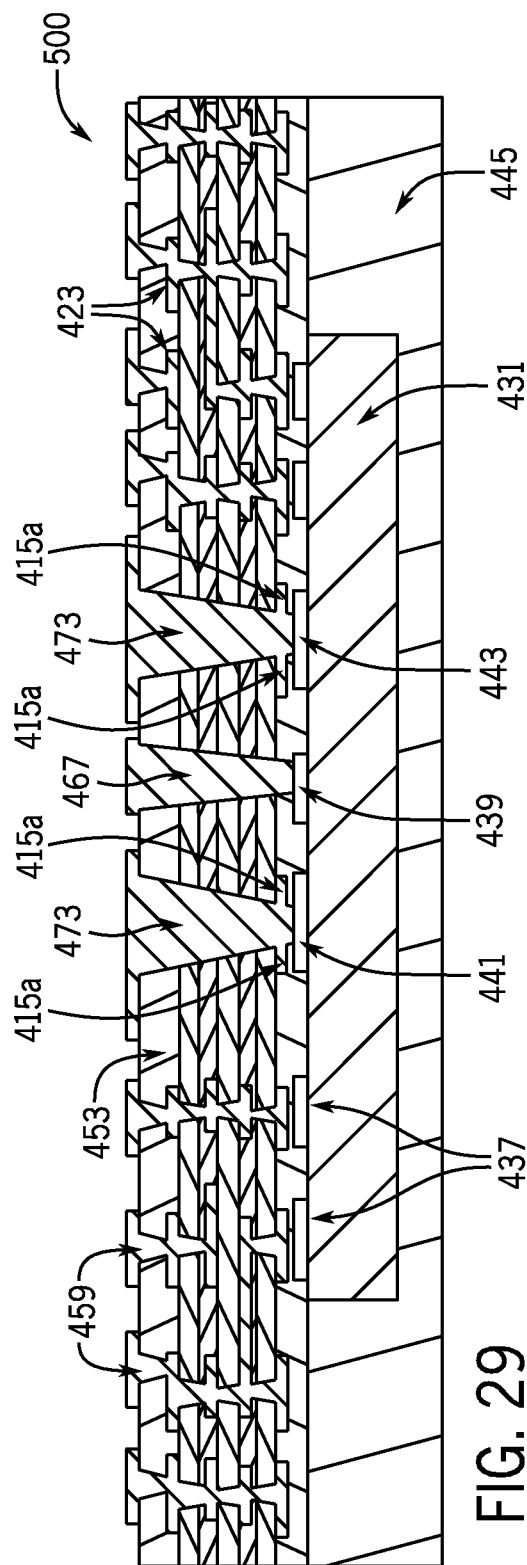
FIG. 29 is a schematic cross-section side view of a sixteenth intermediate structure formed after attaching a complex semiconductor device to the multilayer interconnect structure of FIG. 24, according to an embodiment of the invention.

FIG. 29 is similar to FIG. 27 and depicts a sixteenth intermediate structure 500 that has conductive via connections 409a and 411a replaced by conductive via connections 415a that are on the lower patterned conductor layer 415. Solid conductive vias 473 are formed through openings in conductive via connections 415a.

Figure 30:
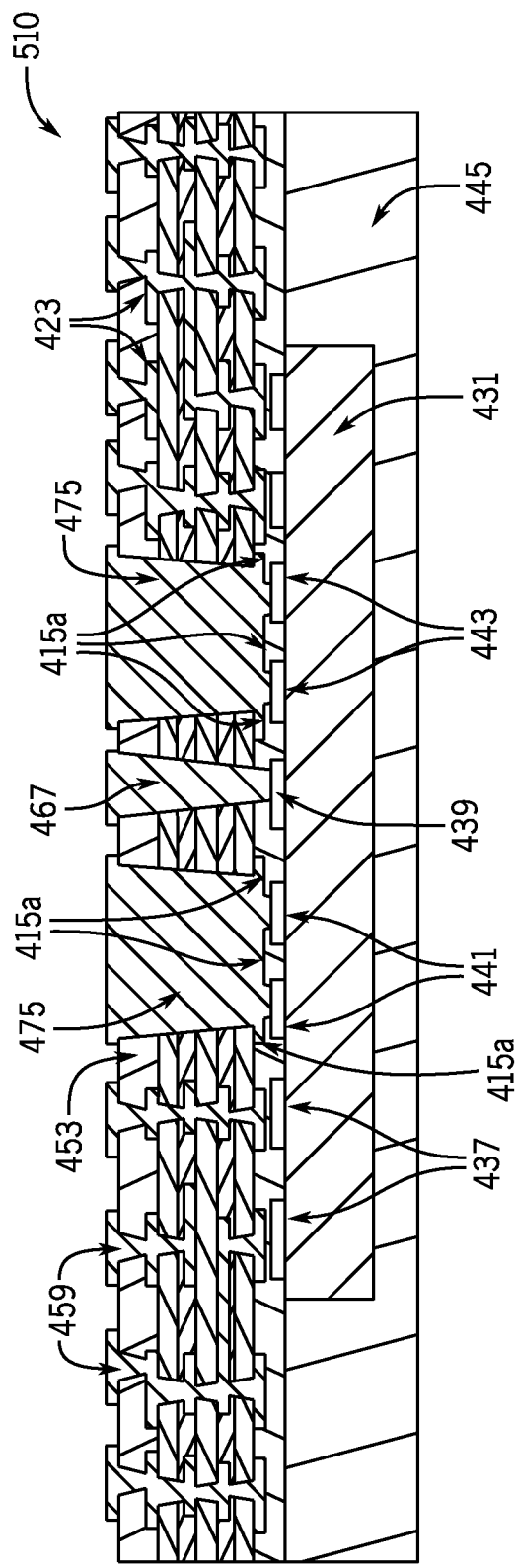
FIG. 30 is a schematic cross-section side view of a seventeenth intermediate structure formed after attaching a complex semiconductor device to the multilayer interconnect structure of FIG. 24, according to an embodiment of the invention.

FIG. 30 is similar to FIG. 27 and depicts a seventeenth intermediate structure 510 that has solid conductive through vias 467a replaced with solid conductive through vias 475 which each connect to a plurality of center I/O device power pads 441 or center I/O device ground pads 443. The solid conductive through vias 475 in seventeenth intermediate structure 510 provide further reductions in the interconnection resistance on the electrical connections to power pads 441 and ground pads 443. Additionally, solid conductive through vias 475 in seventeenth intermediate structure 510 also provide improved thermal spreading and an improved thermal cooling path that can minimize junction temperature with the complex semiconductor device 431.

While the intermediate structures of FIGS. 27-30 are illustrated with the perimeter I/O device signal pads 437 of semiconductor device 431 being capacitively coupled to first lower terminal pads 425 of multilayer interconnect structure 400 due to a thin layer of electrically non-conductive component attach material 433 that is present therebetween, it is recognized that first lower terminal pads 425 can be electrically coupled I/O device signal pads 437 via other means, according to additional embodiments of the invention. That is, first lower terminal pads 425 can be electrically coupled I/O device signal pads 437 via use of an anisotropic conductive adhesive for adhesive 433 (see FIG. 17), via compression bonding between the pads 425 and pads 437 (see FIG. 18), or via use of a localized conductive adhesive or solder applied between pads 425 and pads 437 in openings formed in non-conductive component attach material 433 (see FIG. 22).

Additionally, intermediate structures of FIGS. 27-30 can be further processed to add additional features such as: the addition of through molding conductive vias 191 as depicted in FIG. 14, after package level inputs/outputs (I/Os) 195 (e.g., solder balls) disposed on a bottom surface 197 of through molding conductive vias 191 as depicted in FIG. 15, and stacking of a second electronics module 201 on top of or under the intermediate structures as depicted in FIG. 16.

Figure 31A:
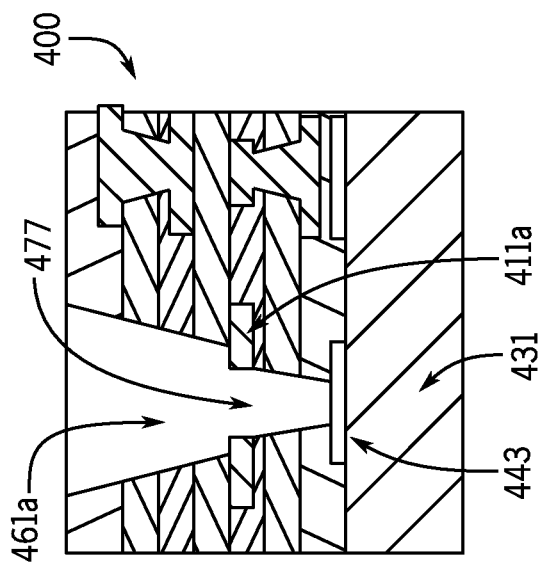
FIGS. 31A-31D are expanded cross-section side views of the multilayer interconnect structure of FIG. 24 prior to and after formation of through vias and conductive through vias therein, according to embodiments of the invention.
Figure 31B:
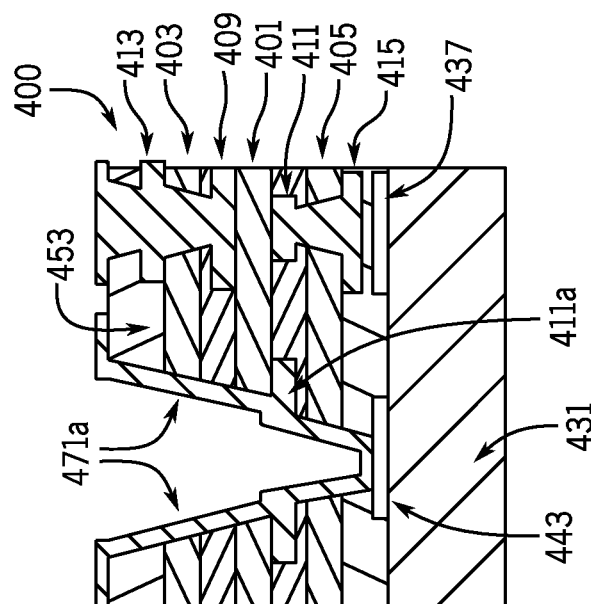
Figure 31C:
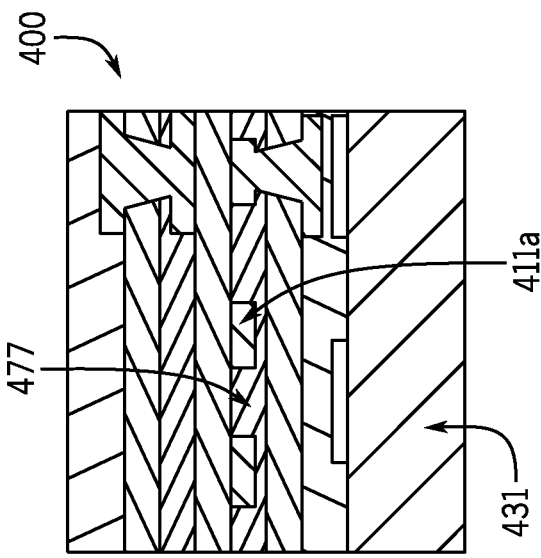
Figure 31D:
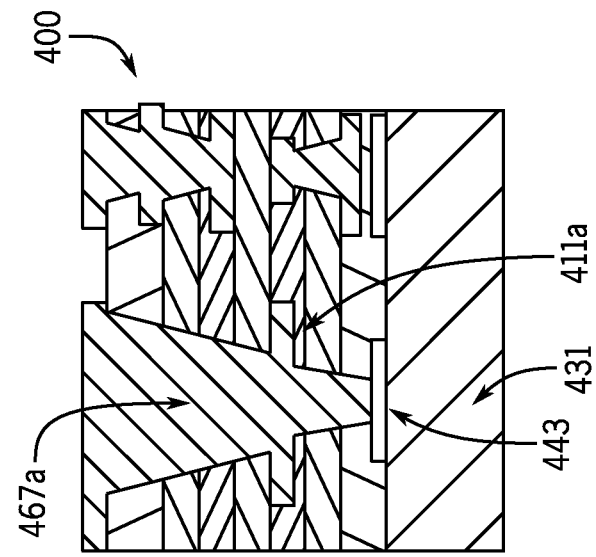

Referring now to FIGS. 31A-31D, detailed views of portions of the multilayer interconnect structure 400 are shown prior to and after formation of vias and conductive vias therein as depicted in FIGS. 25-28, according to embodiments of the invention. FIG. 31A shows a portion of the twelfth intermediate structure 460 of FIG. 25 in greater detail. Second patterned wiring layer 411 is shown as including an aperture 477 formed therethrough to provide for via formation through the conductive feature 411a. FIG. 31B depicts the through vias 461a of FIG. 26 in greater detail. As shown, through vias 461a are formed to have a stepped configuration, with the aperture 477 in conductive feature 411a resulting in a narrower via being formed below conductive feature 411a and down to the I/O pad 441 on complex semiconductor device 431 upon formation thereof via a (laser) ablation technique. FIG. 31C shows the solid conductive vias 467a of FIG. 27 in greater detail, with it being seen therein that solid conductive vias 467a have a stepped configuration following that of through vias 461a. FIG. 31D shows the conformal through vias 471a of FIG. 28 in greater detail, with it being seen therein that conformal through vias 471a have a stepped configuration following that of through vias 461a. The stepped through vias 461a, solid conductive vias 467a, and conformal through vias 471a depicted in FIG. 31 have two key advantages. First, they form a direct electrical connection of the power and ground to interconnect wiring or power/ground planes within multilayer interconnect structure 400—providing a higher performing interconnect structure. Second, they provide more precise vias that connect to center I/O device power pads 441 and center I/O device ground pads 443 of the complex semiconductor device 431, improving yields.

Referring now to FIGS. 32A-32E, cross-sections and conductor layers of fourteenth intermediate structure 480 of FIG. 27 are depicted according to an embodiment where buried patterned conductor layers 409 and 411 are formed/patterned to provide a ground plane and power plane in fourteenth intermediate structure 480.

Figure 32A:
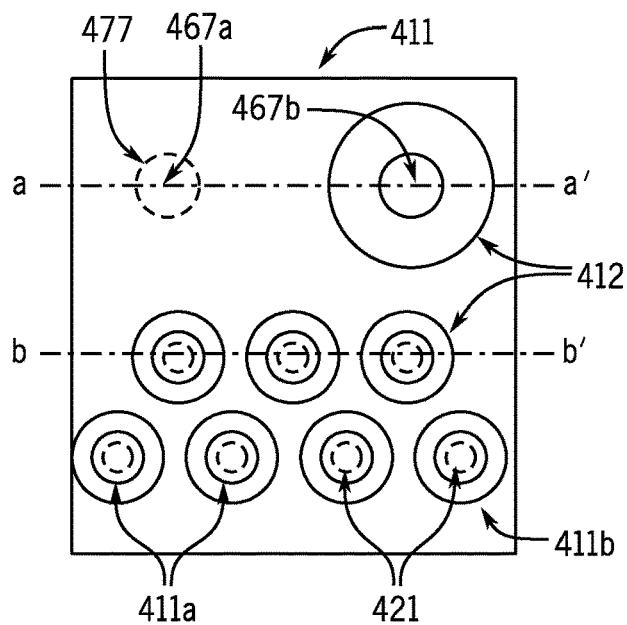
FIGS. 32A-32C are top views of portions of conductor layers of the fourteenth intermediate structure of FIG. 27, according to an embodiment of the invention.

FIG. 32A depicts a top view of patterned conductor layer 411 in intermediate structure 480. Patterned conductor layer 411 is formed to include a double row of conductive microvias 421 and cover pads 411a, as well as solid conductive through vias 467b tied to I/O device power pads 441 and solid conductive through vias 467a tied to I/O device ground pads 443 of complex semiconductor device 431 (FIG. 27). Patterned conductor layer 411 is further formed to include a ground plane 411b covering most of the surface of the interconnect structure 400, with keep-out regions 412 (i.e., regions free of conductive material) formed to isolate conductive microvias 421 and conductive through vias 467b tied to I/O device power pads 441. The ground plane 411b is coupled to solid conductive via 467a that is tied to I/O device ground pads 443. For purposes of forming solid conductive via 467a, apertures 477 are formed through ground plane 411b, with the solid conductive via 467a formed therethrough, as best seen in FIG. 27.

Figure 32B:
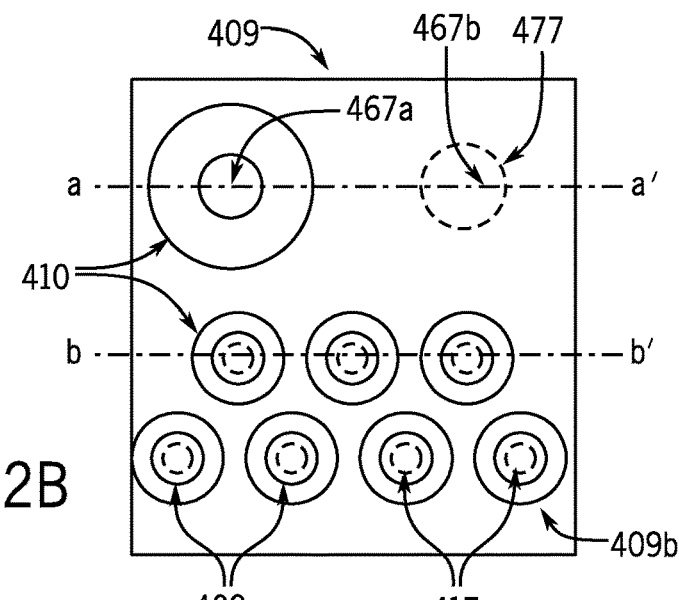

FIG. 32B depicts a top view of patterned conductor layer 409 in intermediate structure 480. Patterned conductor layer 409 is formed to include a double row of conductive microvias 417 and cover pads 409a, as well as solid conductive through vias 467b tied to I/O device power pads 441 and solid conductive through vias 467a tied to I/O device ground pads 443 of complex semiconductor device 431 (FIG. 27). Patterned conductor layer 409 is further formed to include a power plane 409b covering most of the surface of the interconnect structure 400, with keep-out regions 410 (i.e., regions free of conductive material) formed to isolate conductive microvias 417 and conductive through vias 467*a* tied to I/O device ground pads 443. The power plane 409*b* is coupled to solid conductive via 467*b* that is tied to I/O device power pads 441. For purposes of forming solid conductive via 467*b*, apertures 477 are formed through power plane 409*b*, with the solid conductive vias 467*b* formed therethrough, as best seen in FIG. 27.

Figure 32C:
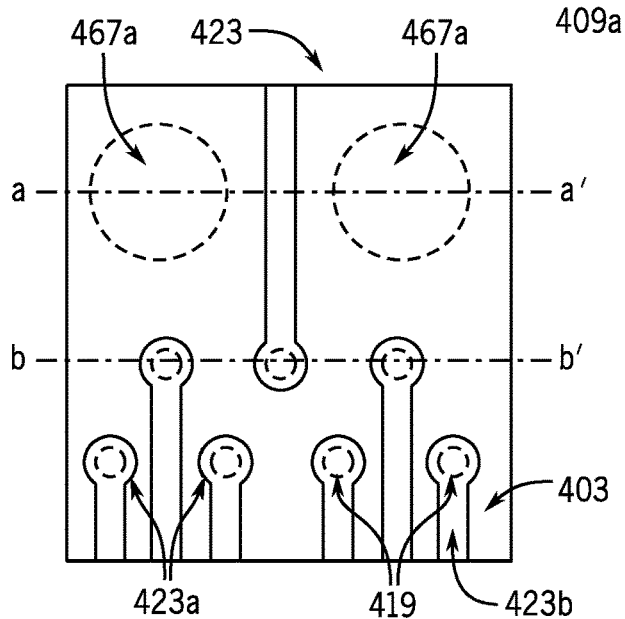

FIG. 32C depicts a top view of patterned conductor layer 423 in intermediate structure 480. Patterned conductor layer 423 is formed to include a double row of conductive microvias 419 and cover pads 423*a* (i.e., upper terminal pads), as well as routing traces 423*b* that tie to selected cover pads 423 in order to redistribute the pads to pre-determined locations for providing I/O connections to the module added after a complex semiconductor device 431 (FIG. 27) is attached to multilayer interconnect structure 400. Conductive through vias 467 (not shown), 467*a*, 467*b* are electrically isolated from cover pads 423, as patterned conductor layer 423 is patterned so as to be mostly free of conductive material (i.e., a majority of insulating substrate layer 403 is left unmetallized, as opposed to patterned conductor layers 409, 411 that include power plane 409*b* and ground plane 411*b*, respectively, that cover most of the surface of the interconnect structure 400).

Figure 32D:
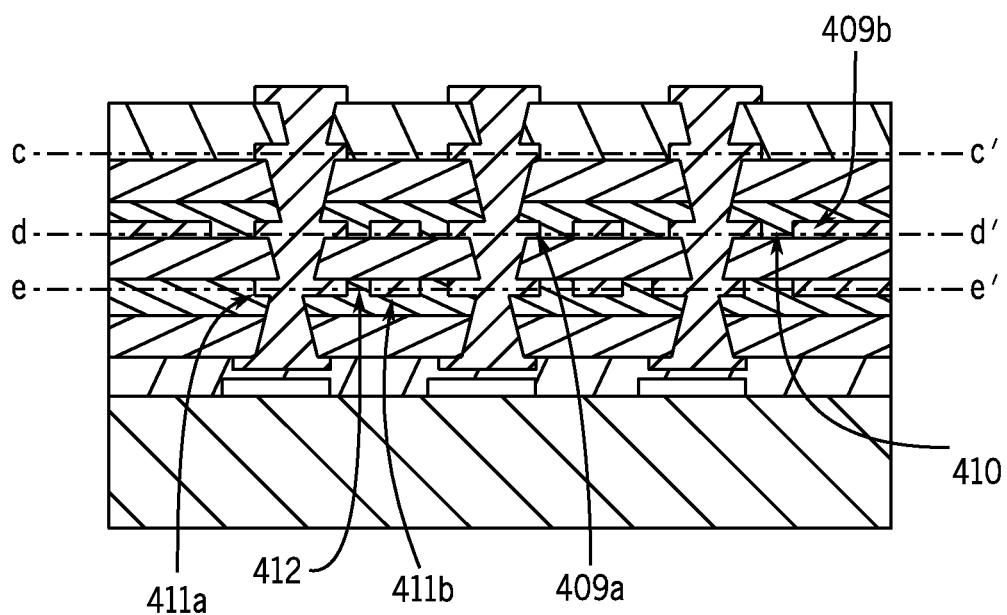
FIGS. 32D-32E are cross-section side views taken along lines a-a' and b-b' of FIGS. 32A-32C, respectively, according to an embodiment of the invention.
Figure 32E:
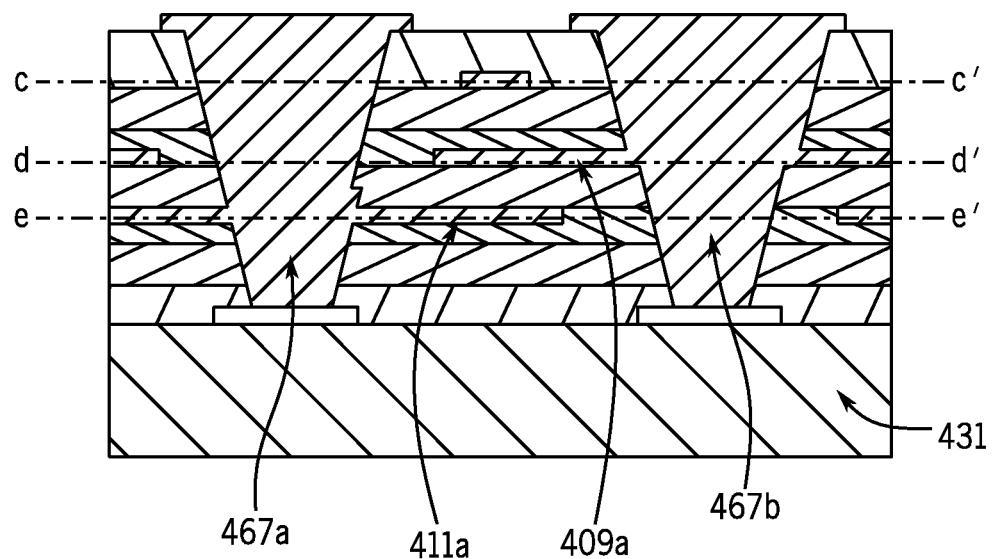

Referring now to FIGS. 32D and 32E, cross-sectional views taken along line b-b' and line a-a' of FIGS. 32A-C are shown, respectively. As first shown in FIG. 32D, the intermediate structure 480 is cut through the upper row of conductive microvias 417, 419, 421 and cover pads 409*a*, 411*a*, 423*a*. For patterned conductor layers 409, 411, the conductive microvias 417, 421 are isolated from ground plane 411*b* and power plane 509*b* by way of keep-out regions 410, 412. As shown in FIG. 32E, the intermediate structure 480 is cut through the solid conductive vias 467*a*, 467*b*. For patterned conductor layer 409, the solid conductive via 467*a* extending down to I/O device ground pad(s) 443 is electrically isolated from power plane 409*b* by keep-out regions 410, while the solid conductive via 467*b* extending down to I/O device power pad(s) 441 is electrically coupled to power plane 409*b*. For patterned conductor layer 411, the solid conductive via 467*b* extending down to I/O device power pad(s) 441 is electrically isolated from ground plane 411*b* by keep-out regions 412, while the solid conductive via 467*a* extending down to I/O device ground pad(s) 443 is electrically coupled to ground plane 411*b*.

Referring now to FIG. 33, a conductor layer 409, 411 included in multilayer interconnect structure 400 is depicted according to another embodiment where one of patterned buried conductor layers 409, 411 is formed as a split plane that defines buried partial power and ground planes, with layer 409 being illustrated in FIG. 33. The conductive layer 409 is patterned to form a split plane where half of the plane is a power plane and half is a ground plane—with a partial power plane 409*c* separated from a partial ground plane 409*d* by a non-conductive area 414. The power plane portion 409*c* of the split plane is in contact with conductive through via 467*b*, which in turn extends down to I/O device power pads 441. The ground plane portion 409*d* of the split plane is in contact with conductive through via 467*a*, which in turn extends down to I/O device ground pads 443. The patterning of conductive layer 409 to form a split plane including partial power plane 409*c* and partial ground plane 409*d* beneficially improves yield in fabricating the interconnect structure 400 (FIG. 24) by saving a whole layer of processing, and it additionally provides robust electrical performance. While FIG. 33 shows buried conductor layer 409 as being patterned to include only a single partial power plane 409*c* and partial ground plane 409*d*, it is recognized that buried conductor layer 409 may be patterned to define multiple distinct partial power planes 409*c* and partial ground planes 409*d* electrically isolated from one another and electrically coupled to respective I/O device power pads 441 and I/O device ground pads 443, according to another embodiment.

With regard to the buried conductive via connections interconnect structure 400 included in conductor layers 409 and 411, it is recognized that such buried conductive via connections could be included in other electronics packages used in a die almost last fabrication process. FIG. 34 illustrates another electronics package 600 that includes such buried conductive via connections, with the electronics package including a semiconductor device 602 and a multilayer interconnect structure 606. The multilayer interconnect structure 606 is composed of multiple insulating substrate layers 616, and multiple conductive wiring layers 618, with microvia connections 620 connecting between adjacent wiring layers. The multiple insulating substrate layers 616 includes an insulating substrate 604 to which the active surface 610 of semiconductor device 602 is bonded by a component attach material 614 such as an adhesive, for example. A cavity 622 is formed in the multilayer interconnect structure 606 forming a window frame around semiconductor device 602. Resin material 624 fills cavity 666 encapsulating semiconductor device 602.

As shown in FIG. 34, a first buried conductive feature or connection 626 is formed on a top surface of insulating substrate 604. Microvias 628 are formed through insulating substrate 604 to selected areas of buried conductive feature or connection 626. A second buried conductive feature or connection 630 is formed on a bottom/outer surface of insulating substrate 604, with an outer insulating layer 634 being applied on the bottom/outer surface of insulating layer 604 and on second buried conductive feature or connection 630.

Buried conductive via connections 626, 630 may be used to optimize the location of through vias 636 that are formed through insulating substrate 604, outer insulating layer 634, and adhesive 614. According to one embodiment, conductive via connections 626, 630 are in the form of cover pads or intra-layer via connections that include an aperture formed therein in order to provide for the formation of through vias (i.e., "shoot-through vias") that aid in via formation accuracy, speed and yield. Additionally, conductive via connections 626, 630 may define buried conductive power and ground planes, respectively, in the interconnect structure 606. The power and ground planes may be formed of copper foil or another similar conductor, for example, and are structured to cover most of the surface/plane of interconnect structure 606 on which they are formed. The power and ground planes may be formed as mostly continuous features/layers or as segmented features divided into different areas that are isolated from one another. Additionally, outer vias 635 and outer wiring layer 637 may be formed on/through outer insulating layer 634 to electrically connect to selected areas of second buried conductive via connections 630, selected areas of first buried conductive via connections 626, and/or conductive wiring layers 618.

Beneficially, embodiments of the invention thus provide an electronics package having a multilayer interconnect structure that includes patterned conductor layers that define buried conductive via connections or features therein. The buried conductive via connections may be in the form of cover pads or intra-layer via connections that include an aperture formed therein in order to provide for the formation of through vias that assist in via formation accuracy, speed, and yield. Additionally, the patterned conductor layers may define buried conductive power and ground planes in the interconnect structure that are easily electrically coupled to I/O device power and ground pads by way of conductive through vias. The power and ground planes may be formed as mostly continuous features/layers or as segmented features divided into different areas that are isolated from one another, with the power and ground planes providing simplified power and grounding functions in the electronics package and also providing EMI shielding to the semiconductor device.

Therefore, according to one embodiment of the invention, an electronics package comprises a multilayer interconnect structure including a plurality of insulating substrate layers, a plurality of conductive wiring layers positioned on the plurality of insulating substrate layers, with each of the plurality of insulating substrate layers having one or more of the plurality of conductive wiring layers positioned thereon, and a plurality of conductive microvias extending through the plurality of insulating substrate layers to electrically connect the plurality of conductive wiring layers, wherein a bottom wiring layer of the plurality of conductive wiring layers includes a plurality of first terminal pads that are positioned on a bottom surface of the multilayer interconnect structure. The electronics package also comprises an electrical component coupled to the bottom surface of the multilayer interconnect structure, the electrical component including a plurality of first input/output (I/O) pads aligned with the plurality of first terminal pads and a plurality of second I/O pads aligned to regions of the multilayer interconnect structure without first terminal pads. The electronics package further comprises a plurality of conductive through vias extending through the multilayer interconnect structure and electrically connected to the plurality of second I/O pads.

According to another embodiment of the invention, a method of manufacturing an electronics package includes providing a pre-fabricated multilayer interconnect structure comprising a top surface and a bottom surface, with the multilayer interconnect structure including a plurality of insulating substrate layers each having a plurality of microvias formed therein and a plurality of conductor layers positioned on the plurality of insulating substrate layers and in the plurality of microvias, the plurality of conductor layers comprising a plurality of first terminal pads positioned on the bottom surface of the multilayer interconnect structure. The method also includes coupling an active surface of a semiconductor device to the bottom surface of the multilayer interconnect structure such that a plurality of semiconductor device first input/output (I/O) pads on the active surface are aligned to the plurality of first terminal pads, forming a plurality of through vias that extend from the top surface of the multilayer interconnect structure down to a plurality of semiconductor device second I/O pads on the active surface of the semiconductor device, and forming conductive through vias in the plurality of through vias that contact the plurality of semiconductor device second I/O pads.

According to yet another embodiment of the invention, an electronics package comprises a multilayer interconnect structure including a plurality of insulating substrate layers each comprising a plurality of microvias formed therein, a plurality of conductive wiring layers positioned on the plurality of insulating substrate layers such that each of the plurality of insulating substrate layers has one or more conductive wiring layers positioned thereon, and a plurality of conductive microvias in the plurality of microvias to electrically connect the plurality of conductive wiring layers, wherein the plurality of conductive wiring layers and the plurality of conductive microvias are positioned in a perimeter region of the multilayer interconnect structure that surrounds a center region of the multilayer interconnect structure. The electronics package also comprises a semiconductor device attached to a bottom surface of the multilayer interconnect structure, the semiconductor device comprising a plurality of first input/output (I/O) pads aligned with the perimeter region and a plurality of second I/O pads aligned with the center region. The electronics package further comprises a plurality of conductive through vias extending through the multilayer interconnect structure in the center region and electrically connected to the plurality of second I/O pads.

According to still another embodiment of the invention, a reconfigured semiconductor device includes a semiconductor device having a plurality of device I/O pads on an active surface thereof, the plurality of device I/O pads comprising first device I/O pads and second device I/O pads. The reconfigured semiconductor device also includes a first redistribution layer on the active surface, the first redistribution layer comprising a first insulating substrate layer, a first plurality of vias formed through the first insulating substrate layer to the plurality of device I/O pads, and a first wiring layer overlying the first insulating substrate layer and extending into the plurality of vias down onto portions of the plurality of device I/O pads, the first wiring layer comprising a plurality of first contact pads connected to the plurality of device I/O pads. The reconfigured semiconductor device further includes an upper redistribution layer overlying the first redistribution layer and comprising an upper insulating substrate layer, a plurality of vias formed through the upper insulating substrate layer to a plurality of contact pads on a wiring layer below the upper insulating substrate layer that comprises the first wiring layer or an additional wiring layer between the first redistribution layer and the upper redistribution layer, and an upper wiring layer overlying the upper insulating substrate layer and extending into the plurality of vias and onto portions of the plurality contact pads on the wiring layer below the upper insulating substrate layer, the upper wiring layer comprising a plurality of upper contact pads connected to a plurality of contact pads on the wiring layer below the upper insulating substrate layer. The upper contact pads comprise first reconfigured device I/O pads and second reconfigured device I/O pads, with each of a plurality of the first reconfigured device I/O pads electrically connected to a single respective first device I/O pad and each of a plurality of the second reconfigured device I/O pads electrically connected to at least two respective second device I/O pads.

According to still another embodiment of the invention, an electronics package includes a multilayer interconnect structure comprising a plurality of insulating substrate layers each having a plurality of microvias formed therein and a plurality of conductor layers positioned on the plurality of insulating substrate layers and in the plurality of microvias, wherein the plurality of conductor layers comprises buried conductive via connections embedded in the multilayer interconnect structure. The electronics package also includes an electrical component attached to the multilayer interconnect structure and aligned with the buried conductive via connections, the electrical component comprising a plurality of input/output (I/O) pads. The electronics package further includes a plurality of conductive through vias extending through the multilayer interconnect structure and forming a direct electrical and physical connection with at least a portion of the plurality of I/O pads, wherein the buried conductive via connections are in physical contact with one or more of the plurality of conductive through vias.

According to still another embodiment of the invention, an electronics package includes a multilayer interconnect structure comprising a plurality of insulating substrate layers and a plurality of conductor layers positioned on the plurality of insulating substrate layers and extending through a plurality of microvias formed therein. The electronics package also includes an electrical component comprising a plurality of input/output (I/O) pads electrically coupled to the plurality of conductor layers and a plurality of conductive through vias extending through a least two insulating substrate layers of the plurality of insulating substrate layers and electrically connected to at least a portion of the plurality of I/O pads. The plurality of conductor layers further includes a first conductor layer including a ground plane buried in the multilayer interconnect structure, the ground plane forming a direct electrical and physical connection with a respective conductive through via that is electrically connected to a ground I/O pad of the plurality of I/O pads, and includes a second conductor layer including a power plane buried in the multilayer interconnect structure, the power plane forming a direct electrical and physical connection with a respective conductive through via that is electrically connected to a power I/O pad of the plurality of I/O pads.

According to still another embodiment of the invention, an electronics package includes a multilayer interconnect structure comprising a plurality of insulating substrate layers and a plurality of conductor layers positioned on the plurality of insulating substrate layers and extending through a plurality of microvias formed therein. The electronics package also includes an electrical component comprising a plurality of input/output (I/O) pads electrically coupled to the plurality of conductor layers and a plurality of conductive through vias extending through at least two insulating substrate layers of the plurality of insulating substrate layers and electrically connected to at least a portion of the plurality of I/O pads. The plurality of conductor layers includes a first conductor layer comprising a partial ground plane buried in the multilayer interconnect structure and forming a direct electrical and physical connection with a respective conductive through via that is electrically connected to a ground I/O pad of the plurality of I/O pads and a partial power plane buried in the multilayer interconnect structure and forming a direct electrical and physical connection with a respective conductive through via that is electrically connected to a power I/O pad of the plurality of I/O pads.

According to still another embodiment of the invention, a method of manufacturing an electronics package includes providing a multilayer interconnect structure comprising a plurality of insulating substrate layers each having a plurality of microvias formed therein and a plurality of conductor layers positioned on the plurality of insulating substrate layers and in the plurality of microvias, at least one of the plurality of conductor layers including at least one buried conductive via aperture embedded in the multilayer interconnect structure. The method also includes attaching an active surface of an electrical component to the interconnect structure, forming at least one shoot through via that extends through the at least one buried conductive via aperture down to at least one I/O pad of a plurality of I/O pads on the active surface of the electrical component, and forming a conductive through via in each of the at least one shoot through vias that physically contacts a respective buried conductive via aperture to form at least one buried conductive via connection and that physically contacts a respective I/O pad of the plurality of I/O pads.

According to still another embodiment of the invention, an electronics package includes a plurality of insulating substrate layers each having a plurality of microvias formed therein, a plurality of conductor layers positioned on the plurality of insulating substrate layers and in the plurality of microvias, and a plurality of conductive through vias extending through at least two of the plurality of insulating substrate layers. The plurality of conductor layers comprises includes a first conductor layer including a ground plane buried in the electronics package, the ground plane forming a direct electrical and physical connection with a first conductive through via of the plurality of conductive through vias and a second conductor layer including a power plane buried in the electronics package, the power plane forming a direct electrical and physical connection with a second conductive through via of the plurality of conductive through vias.

Embodiments of the present invention have been described in terms of the preferred embodiment, and it is recognized that equivalents, alternatives, and modifications, aside from those expressly stated, are possible and within the scope of the appending claims.

What is claimed is:

1. An electronics package comprising:
    a multilayer interconnect structure comprising:
        a plurality of insulating substrate layers each having a plurality of microvias formed therein; and
        a plurality of conductor layers positioned on the plurality of insulating substrate layers and in the plurality of microvias, wherein the plurality of conductor layers comprise buried conductive via connections embedded in the multilayer interconnect structure;
    an electrical component attached to the multilayer interconnect structure and aligned with the buried conductive via connections, the electrical component comprising a plurality of input/output (I/O) pads; and
    a plurality of conductive through vias extending through the multilayer interconnect structure and forming a direct electrical and physical connection with at least a portion of the plurality of I/O pads;
    wherein the buried conductive via connections are in physical contact with one or more of the plurality of conductive through vias;
    wherein the plurality of I/O pads includes signal I/O pads, ground I/O pads, and power I/O pads; and
    wherein a respective buried conductive via connection of the buried conductive via connections is electrically connected to one or more of the power I/O pads by way of a respective conductive through via.

2. The electronics package of claim 1 wherein each of the buried conductive via connections comprises an aperture formed therethrough, and wherein the conductive through via in physical contact with its respective buried conductive via connection extends through the aperture.

3. The electronics package of claim 1 wherein a respective buried conductive via connection of the buried conductive via connections is electrically connected to one or more of the ground I/O pads by way of a respective conductive through via.

4. The electronics package of claim 3 wherein the buried conductive via connection electrically connected to the one or more ground I/O pads comprises a ground plane.

5. The electronics package of claim 1 wherein the buried conductive via connection electrically connected to the one or more power I/O pads comprises a power plane.

6. The electronics package of claim 1 wherein a bottom conductor layer of the plurality of conductor layers includes a plurality of terminal pads that are positioned on a bottom surface of the multilayer interconnect structure, and wherein the electrical component is attached to the bottom surface of the multilayer interconnect structure by a component attach material.

7. The electronics package of claim 6 wherein a plurality of the signal I/O pads are aligned with and electrically coupled to the plurality of terminal pads, and wherein the ground I/O pads and the power I/O pads are directly coupled to at least a portion of the plurality of conductive through vias.

8. An electronics package comprising:
a multilayer interconnect structure comprising:
a plurality of insulating substrate layers; and
a plurality of conductor layers positioned on the plurality of insulating substrate layers and extending through a plurality of microvias formed therein;
an electrical component comprising a plurality of input/output (I/O) pads electrically coupled to the plurality of conductor layers; and
a plurality of conductive through vias extending through a least two insulating substrate layers of the plurality of insulating substrate layers and electrically connected to at least a portion of the plurality of I/O pads;
wherein the plurality of conductor layers comprises:
a first conductor layer including a ground plane buried in the multilayer interconnect structure, the ground plane forming a direct electrical and physical connection with a respective conductive through via that is electrically connected to a ground I/O pad of the plurality of I/O pads; and
a second conductor layer including a power plane buried in the multilayer interconnect structure, the power plane forming a direct electrical and physical connection with a respective conductive through via that is electrically connected to a power I/O pad of the plurality of I/O pads.

9. The electronics package of claim 8 wherein the ground plane is electrically isolated from conductive microvias of the first conductor layer and the conductive through vias that are electrically connected to the power I/O pad.

10. The electronics package of claim 8 wherein the power plane is electrically isolated from conductive microvias of the second conductor layer and the conductive through vias that are electrically connected to the ground I/O pad.

11. The electronics package of claim 8 wherein each of the ground plane and the power plane includes apertures formed therein, with the plurality of conductive through vias extending through the apertures.

12. An electronics package comprising:
a multilayer interconnect structure comprising:
a plurality of insulating substrate layers; and
a plurality of conductor layers positioned on the plurality of insulating substrate layers and extending through a plurality of microvias formed therein;
an electrical component comprising a plurality of input/output (I/O) pads electrically coupled to the plurality of conductor layers; and
a plurality of conductive through vias extending through at least two insulating substrate layers of the plurality of insulating substrate layers and electrically connected to at least a portion of the plurality of I/O pads;
wherein the plurality of conductor layers comprises a first conductor layer comprising:
a partial ground plane buried in the multilayer interconnect structure, the partial ground plane forming a direct electrical and physical connection with a respective conductive through via that is electrically connected to a ground I/O pad of the plurality of I/O pads; and
a partial power plane buried in the multilayer interconnect structure, the partial power plane forming a direct electrical and physical connection with a respective conductive through via that is electrically connected to a power I/O pad of the plurality of I/O pads.

13. An electronics package comprising:
a plurality of insulating substrate layers each having a plurality of microvias formed therein; and
a plurality of conductor layers positioned on the plurality of insulating substrate layers and in the plurality of microvias; and
a plurality of conductive through vias extending through at least two of the plurality of insulating substrate layers;
wherein the plurality of conductor layers comprises:
a first conductor layer including a ground plane buried in the electronics package, the ground plane forming a direct electrical and physical connection with a first conductive through via of the plurality of conductive through vias; and
a second conductor layer including a power plane buried in the electronics package, the power plane forming a direct electrical and physical connection with a second conductive through via of the plurality of conductive through vias.

14. The electronics package of claim 13 wherein each of the first conductor layer and the second conductor layer comprises at least one aperture formed therein through which a respective conductive through via extends.

15. The electronics package of claim 13 wherein the ground plane includes keep-out regions formed therein that electrically isolate the ground plane from conductive microvias of the first conductor layer and from the second conductive through via.

16. The electronics package of claim 13 wherein the power plane includes keep-out regions formed therein that electrically isolate the power plane from conductive microvias of the second conductor layer and from the first conductive through via.

* * * * *